US007960091B2

(12) United States Patent
Shimizu et al.

(10) Patent No.: US 7,960,091 B2
(45) Date of Patent: Jun. 14, 2011

(54) RESIST COMPOSITION AND METHOD OF FORMING RESIST PATTERN

(75) Inventors: Hiroaki Shimizu, Kawasaki (JP);
Tsuyoshi Nakamura, Kawasaki (JP);
Takahiro Dazai, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 97 days.

(21) Appl. No.: 12/356,011

(22) Filed: Jan. 19, 2009

(65) Prior Publication Data

US 2009/0197197 A1 Aug. 6, 2009

(30) Foreign Application Priority Data

Jan. 31, 2008 (JP) .................. P2008-021698

(51) Int. Cl.
G03F 7/00 (2006.01)
G03F 7/004 (2006.01)
G03F 7/26 (2006.01)
G03F 7/40 (2006.01)

(52) U.S. Cl. ............... 430/270.1; 430/311; 430/331

(58) Field of Classification Search ............ 430/270.1, 430/311, 331
See application file for complete search history.

(56) References Cited

U.S. PATENT DOCUMENTS

| 3,816,314 | A | * | 6/1974 | Pappas et al. ............. 508/470 |
| 5,037,930 | A | * | 8/1991 | Shih ............................. 527/301 |
| 5,043,415 | A | * | 8/1991 | Harris et al. ................ 528/205 |
| 5,229,354 | A | * | 7/1993 | Narayanan et al. ......... 504/113 |
| 5,945,517 | A | | 8/1999 | Nitta et al. |
| 6,153,733 | A | | 11/2000 | Yukawa et al. |
| 6,281,172 | B1 | * | 8/2001 | Warren et al. ............... 507/110 |
| 6,451,943 | B1 | * | 9/2002 | Burkhardt et al. .......... 526/265 |
| 7,067,231 | B2 | * | 6/2006 | Harada et al. .............. 430/270.1 |
| 7,232,641 | B2 | * | 6/2007 | Hatakeyama et al. ...... 430/270.1 |
| 7,252,924 | B2 | * | 8/2007 | Yamanaka et al. ......... 430/270.1 |
| 7,323,287 | B2 | | 1/2008 | Iwai et al. |
| 7,332,616 | B2 | * | 2/2008 | Hatakeyama et al. ........... 549/54 |
| 7,771,914 | B2 | * | 8/2010 | Hatakeyama et al. ...... 430/270.1 |
| 2002/0035223 | A1 | * | 3/2002 | Burkhardt et al. .......... 526/265 |
| 2007/0078269 | A1 | * | 4/2007 | Harada et al. ................ 549/266 |
| 2008/0096134 | A1 | * | 4/2008 | Sugimoto et al. .......... 430/287.1 |
| 2008/0103287 | A1 | * | 5/2008 | Chino et al. ................ 528/421 |
| 2009/0042131 | A1 | * | 2/2009 | Shiono et al. .............. 430/285.1 |
| 2010/0004149 | A1 | * | 1/2010 | Johnson et al. .............. 508/470 |

FOREIGN PATENT DOCUMENTS

| JP | 62243607 A | * | 10/1987 |
| JP | H09-208554 | | 8/1997 |
| JP | H11-035551 | | 2/1999 |
| JP | H11-035552 | | 2/1999 |
| JP | H11-035573 | | 2/1999 |
| JP | H11-322707 | | 11/1999 |
| JP | 2003-241385 | | 8/2003 |
| JP | 2006089694 A | * | 4/2006 |
| JP | 2006143644 A | * | 6/2006 |
| JP | 2006241194 A | * | 9/2006 |
| JP | 2007008973 A | * | 1/2007 |
| WO | WO 2004/074242 A2 | | 9/2004 |

OTHER PUBLICATIONS

Liu et al, "Reactive-HALS I: Synthesis, Characterization, Copolymerization, Reactivity, and Photo-Stabilizing Performance Applied in UV-Curable Coatings", Polymers of Advanced Technologies, 2002; 13, 247-253.*

* cited by examiner

Primary Examiner — Amanda C. Walke
(74) Attorney, Agent, or Firm — Knobbe, Martens, Olson & Bear, LLP

(57) ABSTRACT

A resist composition comprising a base component (A) which exhibits changed solubility in an alkali developing solution under action of acid, an acid-generator component (B) which generates acid upon exposure, and a nitrogen-containing organic compound (D), the nitrogen-containing organic compound (D) including a nitrogen-containing polymeric compound (D1) having a structural unit (d0) containing a nitrogen atom in the side chain thereof.

13 Claims, No Drawings

RESIST COMPOSITION AND METHOD OF FORMING RESIST PATTERN

TECHNICAL FIELD

The present invention relates to a resist composition, and a method of forming a resist pattern using the resist composition.

Priority is claimed on Japanese Patent Application No. 2008-021698, filed Jan. 31, 2008, the content of which is incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are now starting to be introduced in mass production. Furthermore, research is also being conducted into lithography techniques that use exposure light source having a wavelength shorter than these excimer lasers, such as $F_2$ excimer lasers, electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources. As a resist material which satisfies these conditions, a chemically amplified resist composition is used, which includes a base component that exhibits a changed solubility in an alkali developing solution under action of acid and an acid generator that generates acid upon exposure.

For example, a chemically amplified positive resist contains, as a base component (base resin), a resin which exhibits increased solubility in an alkali developing solution under action of acid, and an acid generator is typically used. With respect to a resist film formed by using such a resist composition, when acid is generated from the acid generator at exposed portions, the solubility of the resin component in an alkali developing solution is increased by the action of acid. As a result, the exposed portions become soluble in an alkali developing solution.

Currently, resins that contain structural units derived from (meth)acrylate esters within the main chain (acrylic resins) are now widely used as base resins for resists that use ArF excimer laser lithography, as they exhibit excellent transparency in the vicinity of 193 nm (see, for example, Patent Document 1).

Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

[Patent Document 1] Japanese Unexamined Patent Application, First Publication No. 2003-241385

SUMMARY OF THE INVENTION

In recent years, as the miniaturization of resist patterns progress, not only high resolutions, but also improvement in various lithography properties has been demanded for conventional resist compositions. Among the various lithography properties, improvement in depth of focus (DOF) property has been demanded for improving the process margin or the like.

The "DOF" is the range of depth of focus in which a resist pattern having a predetermined size within the range corresponding to the target size can be formed when the exposure focus is moved upwardly or downwardly with the same exposure dose, i.e., the range in which a resist pattern faithful to the mask pattern can be obtained. Larger DOF is more preferable.

However, conventional resist compositions had a problem in that the DOF property was unsatisfactory.

The present invention takes the above circumstances into consideration, with an object of providing a resist composition exhibiting excellent lithography properties with respect to depth of focus (DOF) and the like, and a method of forming a resist pattern using the resist composition.

For solving the above-mentioned problems, the present invention employs the following aspects.

Specifically, a first aspect of the present invention is a resist composition comprising a base component (A) which exhibits changed solubility in an alkali developing solution under action of acid, an acid-generator component (B) which generates acid upon exposure, and a nitrogen-containing organic compound (D), the nitrogen-containing organic compound (D) including a nitrogen-containing polymeric compound (D1) having a structural unit (d0) containing a nitrogen atom in the side chain thereof.

A second aspect of the present invention is a method of forming a resist pattern, including: applying a resist composition of the first aspect to a substrate to form a resist film on the substrate; conducting exposure of the resist film; and alkali-developing the resist film to form a resist pattern.

In the present description and claims, the term "alkyl group" includes linear, branched or cyclic, monovalent saturated hydrocarbon, unless otherwise specified.

The term "alkylene group" includes linear, branched or cyclic divalent saturated hydrocarbon, unless otherwise specified.

A "lower alkyl group" is an alkyl group of 1 to 5 carbon atoms.

A "halogenated alkyl group" is a group in which a part or all of the hydrogen atoms of an alkyl group is substituted with halogen atoms. Examples of halogen atoms include fluorine atoms, chlorine atoms, bromine atoms and iodine atoms.

The term "aliphatic" is a relative concept used in relation to the term "aromatic", and defines a group or compound that has no aromaticity.

The term "structural unit" refers to a monomer unit that contributes to the formation of a polymeric compound (polymer, copolymer).

The term "exposure" is used as a general concept that includes irradiation with any form of radiation.

According to the present invention, there are provided a resist composition exhibiting excellent lithography properties with respect to depth of focus (DOF) and the like, and a method of forming a resist pattern using the resist composition.

DETAILED DESCRIPTION OF THE INVENTION

<<Resist Composition>>

The resist composition according to the first aspect of the present invention includes a base component (A) which exhibits changed solubility in an alkali developing solution under action of acid (hereafter, referred to as "component (A)"), an acid-generator component (B) which generates acid upon exposure (hereafter, referred to as "component (B)"), and a nitrogen-containing organic compound (D) (hereafter, referred to as "component (D)").

With respect to a resist film formed using the resist composition, when a selective exposure is conducted during formation of a resist pattern, acid is generated from the component (B), and the generated acid acts on the component (A) to change the solubility of the component (A) in an alkali developing solution. As a result, the solubility of the exposed portions in an alkali developing solution is changed, whereas the solubility of the unexposed portions in an alkali developing solution remains unchanged. Therefore, the exposed portions are dissolved and removed by alkali developing in the case of a positive resist composition, whereas unexposed portions are dissolved and removed in the case of a negative resist composition, and hence, a resist pattern can be formed.

The resist composition of the present invention may be either a negative resist composition or a positive resist composition.

<Component (A)>

As the component (A), an organic compound typically used as a base component for a chemically amplified resist composition can be used alone, or two or more of such organic compounds can be mixed together. However, the component (A) is not included in the component (D1) described below.

Here, the term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compounds having a molecular weight of 500 or more are broadly classified into low molecular weight organic compounds having a molecular weight of 500 to less than 2,000 (hereafter, frequently referred to as "low molecular weight compounds") and high molecular weight resins (polymeric materials) having a molecular weight of 2,000 or more. Generally, as the aforementioned low molecular weight compound, a non-polymer is used. With respect to the aforementioned resin (polymer or copolymer), the molecular weight is the polystyrene equivalent value determined by gel permeation chromatography (GPC). Hereafter, a "resin" refers to a resin having a molecular weight of 2,000 or more.

As the component (A), a resin which exhibits changed solubility in an alkali developing solution under action of acid may be used. Alternatively, as the component (A), a low molecular weight material which exhibits changed solubility in an alkali developing solution under action of acid may be used.

When the resist composition of the present invention is a negative resist composition, for example, as the component (A), a base component that is soluble in an alkali developing solution is used, and a cross-linking agent is blended in the negative resist composition.

In the negative resist composition, when acid is generated from the component (B) upon exposure, the action of the generated acid causes cross-linking between the base component and the cross-linking agent, and the cross-linked portion becomes insoluble in an alkali developing solution. Therefore, in the formation of a resist pattern, by conducting selective exposure of a resist film formed by applying the negative resist composition onto a substrate, the exposed portions become insoluble in an alkali developing solution, whereas the unexposed portions remain soluble in an alkali developing solution, and hence, a resist pattern can be formed by alkali developing.

Generally, as the component (A) for a negative resist composition, a resin that is soluble in an alkali developing solution (hereafter, referred to as "alkali-soluble resin") is used.

As the alkali-soluble resin, it is preferable to use a resin having a structural unit derived from at least one of α-(hydroxyalkyl)acrylic acid and a lower alkyl ester of α-(hydroxyalkyl)acrylic acid, as it enables formation of a satisfactory resist pattern with minimal swelling. Here, the term "α-(hydroxyalkyl) acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (preferably a hydroxyalkyl group of 1 to 5 carbon atoms) is bonded to the carbon atom on the α-position.

As the cross-linking agent, typically, an amino-based cross-linking agent such as a glycoluril having a methylol group or alkoxymethyl group is preferable, as it enables formation of a resist pattern with minimal swelling. The amount of the cross-linking agent added is preferably within the range from 1 to 50 parts by weight, relative to 100 parts by weight of the alkali-soluble resin.

When the resist composition of the present invention is a positive resist composition, as the component (A), a base component (A') which exhibits increased solubility in an alkali developing solution by action of acid (hereafter, referred to as "component (A')") is used. The component (A') is insoluble in an alkali developing solution prior to exposure, and when acid is generated from the component (B) upon exposure, the solubility of the component (A') in an alkali developing solution increases. Therefore, in the formation of a resist pattern, by conducting selective exposure of a resist film formed by applying the positive resist composition onto a substrate, the exposed portions changes from an insoluble state to a soluble state in an alkali developing solution, whereas the unexposed portions remain insoluble in an alkali developing solution, and hence, a resist pattern can be formed by alkali developing.

In the resist composition of the present invention, the component (A) is preferably a base component (A') which exhibits increased solubility in an alkali developing solution under action of acid. That is, the resist composition of the present invention is preferably a positive resist composition.

The component (A') may be a resin component (A1) which exhibits increased solubility in an alkali developing solution under action of acid (hereafter, referred to as "component (A1)"), a low molecular weight compound (A2) which exhibits increased solubility in an alkali developing solution under action of acid (hereafter, referred to as "component (A2)"), or a mixture of the component (A1) and the component (A2).

[Component (A1)]

As the component (A1), a resin component (base resin) typically used as a base component for a chemically amplified resist composition can be used alone, or two or more of such resin components can be mixed together.

In the present invention, it is preferable that the component (A1) include a structural unit derived from an acrylate ester.

In the present descriptions and the claims, the term "structural unit derived from an acrylate ester" refers to a structural unit which is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. As the substituent, a lower alkyl group or a halogenated lower alkyl group can be mentioned.

With respect to the "structural unit derived from an acrylate ester", the "α-position (the carbon atom on the α-position)" refers to the carbon atom having the carbonyl group bonded thereto, unless specified otherwise.

With respect to the acrylate ester, specific examples of the lower alkyl group for the substituent at the α-position include linear or branched alkyl groups such as a methyl group, ethyl group, propyl group, isopropyl group, n-butyl group, isobutyl group, tert-butyl group, pentyl group, isopentyl group, and neopentyl group.

Specific examples of the halogenated lower alkyl group include groups in which some or all of the hydrogen atoms of the aforementioned "lower alkyl group for the substituent at the α-position" are substituted with halogen atoms. Examples of halogen atoms include fluorine atoms, chlorine atoms, bromine atoms and iodine atoms, and fluorine atoms are particularly desirable.

In the present invention, it is preferable that a hydrogen atom, a lower alkyl group or a halogenated lower alkyl group is bonded to the α-position of the acrylate ester, more preferably a hydrogen atom, a lower alkyl group or a fluorinated lower alkyl group. In terms of industrial availability, a hydrogen atom or a methyl group is particularly desirable.

It is particularly desirable that the component (A1) have a structural unit (a1) derived from an acrylate ester containing an acid dissociable, dissolution inhibiting group.

Further, it is preferable that the component (A1) have a structural unit (a2) derived from an acrylate ester containing a lactone-containing cyclic group, as well as the structural unit (a1).

Furthermore, it is preferable that the component (A1) have a structural unit (a3) derived from an acrylate ester containing a polar group-containing aliphatic hydrocarbon group, as well as the structural unit (a1), or the structural unit (a1) and the structural unit (a2).

Structural unit (a1)

As the acid dissociable, dissolution inhibiting group in the structural unit (a1), any of the groups that have been proposed as acid dissociable, dissolution inhibiting groups for the base resins of chemically amplified resists can be used, provided the group has an alkali dissolution-inhibiting effect that renders the entire component (A1) insoluble in an alkali developing solution prior to dissociation, and then following dissociation by action of acid, increases the solubility of the entire component (A1) in the alkali developing solution.

Generally, groups that form either a cyclic or chain-like tertiary alkyl ester with the carboxyl group of the (meth) acrylic acid, and acetal-type acid dissociable, dissolution inhibiting groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

The term "aliphatic branched" refers to a branched structure having no aromaticity.

The "aliphatic branched, acid dissociable, dissolution inhibiting group" is not limited to be constituted of only carbon atoms and hydrogen atoms (not limited to hydrocarbon groups), but is preferably a hydrocarbon group.

Further, the "hydrocarbon group" may be either saturated or unsaturated, but is preferably saturated.

Examples of aliphatic branched, acid dissociable, dissolution inhibiting groups include tertiary alkyl groups of 4 to 8 carbon atoms, and specific examples include a tert-butyl group, tert-pentyl group and tert-heptyl group.

The term "aliphatic cyclic group" refers to a monocyclic group or polycyclic group that has no aromaticity.

The "aliphatic cyclic group" within the structural unit (a1) may or may not have a substituent. Examples of substituents include lower alkyl groups of 1 to 5 carbon atoms, fluorine atom, fluorinated lower alkyl groups of 1 to 5 carbon atoms, and oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated lower alkyl group, may be exemplified. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

As the aliphatic cyclic group-containing acid dissociable, dissolution inhibiting group, for example, a group which has a tertiary carbon atom on the ring structure of the cycloalkyl group can be mentioned. Specific examples include 2-methyl-2-adamantyl group and a 2-ethyl-2-adamantyl group. Further, groups having an aliphatic cyclic group such as an adamantyl group, cyclohexyl group, cyclopentyl group, norbornyl group, tricyclodecanyl group or tetracyclododecanyl group, and a branched alkylene group having a tertiary carbon atom bonded thereto, as the groups bonded to the oxygen atom of the carbonyl group (—C(O)—O—) within the structural units represented by general formulas (a1'-1) to (a1'-6) shown below, can be exemplified.

[Chemical Formula 1.]

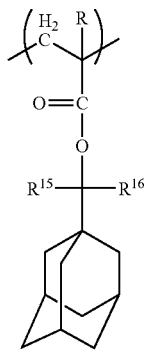

(a1″-1)

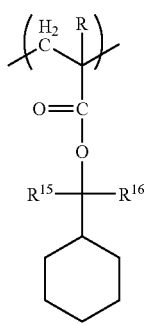

(a1″-2)

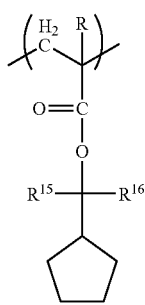

(a1″-3)

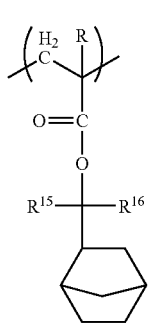

(a1″-4)

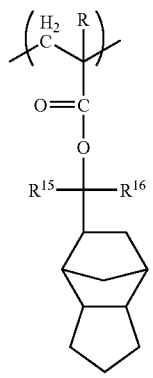

(a1″-5)

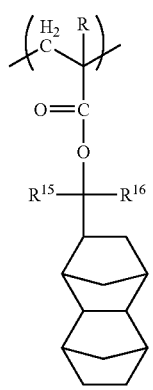

(a1″-6)

wherein R represents a hydrogen atom, a lower alkyl group or a halogenated lower alkyl group; and $R^{15}$ and $R^{16}$ each independently represents an alkyl group (which may be linear or branched, and preferably has 1 to 5 carbon atoms).

In general formulas (a1'-1) to (a1'-6) above, the lower alkyl group or halogenated lower alkyl group for R are the same as the lower alkyl group or halogenated lower alkyl group which can be bonded to the α-position of the aforementioned acrylate ester.

An "acetal-type acid dissociable, dissolution inhibiting group" generally substitutes a hydrogen atom at the terminal of an alkali-soluble group such as a carboxy group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 2]

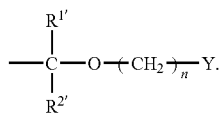

(p 1)

wherein $R^{1\prime}$ and $R^{2\prime}$ each independently represents a hydrogen atom or a lower alkyl group; n represents an integer of 0 to 3; and Y represents a lower alkyl group or an aliphatic cyclic group.

In general formula (p1) above, n is preferably an integer of 0 to 2, more preferably 0 or 1, and most preferably 0.

As the lower alkyl group for $R^{1'}$ and $R^{2'}$ the same as the lower alkyl groups for R above can be exemplified. As the lower alkyl group for $R^{1'}$ and $R^{2'}$, a methyl group or ethyl group is preferable, and a methyl group is particularly desirable.

In the present invention, it is preferable that at least one of $R^{1'}$ and $R^{2'}$ be a hydrogen atom. That is, it is preferable that the acid dissociable, dissolution inhibiting group (p1) is a group represented by general formula (p1-1) shown below.

[Chemical Formula 3]

(p 1-1)

wherein $R^{1'}$, n and Y are as defined above.

As the lower alkyl group for Y, the same as the lower alkyl groups for R above can be exemplified.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be exemplified.

Further, as the acetal-type, acid dissociable, dissolution inhibiting group, groups represented by general formula (p2) shown below can also be exemplified.

[Chemical Formula 4]

(p 2)

wherein $R^{17}$ and $R^{18}$ each independently represents a linear or branched alkyl group or a hydrogen atom; and $R^{19}$ represents a linear, branched or cyclic alkyl group; or $R^{17}$ and $R^{19}$ each independently represents a linear or branched alkylene group, wherein the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be exemplified. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Of these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto and the carbon atom having the oxygen atom and $R^{17}$ bonded thereto. Such a cyclic group is preferably a 4 to 7-membered ring, and more preferably a 4 to 6-membered ring. Specific examples of the cyclic group include tetrahydropyranyl group and tetrahydrofuranyl group.

As the structural unit (a1), it is preferable to use at least one member selected from the group consisting of structural units represented by formula (a1-0-1) shown below and structural units represented by formula (a1-0-2) shown below.

[Chemical Formula 5]

(a 1-0-1)

wherein R represents a hydrogen atom, a lower alkyl group or a halogenated lower alkyl group; and $X^1$ represents an acid dissociable, dissolution inhibiting group.

[Chemical Formula 6]

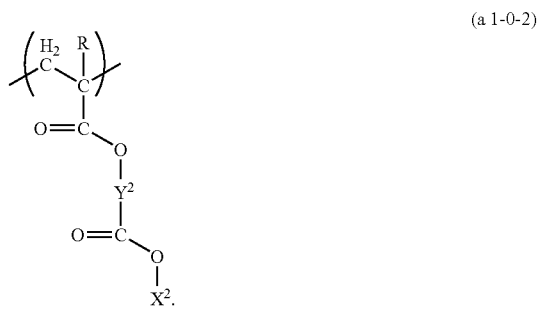

(a 1-0-2)

wherein R represents a hydrogen atom, a lower alkyl group or a halogenated lower alkyl group; $X^2$ represents an acid dissociable, dissolution inhibiting group; and $Y^2$ represents an alkylene group or a divalent aliphatic cyclic group.

In general formula (a1-0-1) shown above, lower alkyl group and halogenated lower alkyl group for R are the same as the lower alkyl group and halogenated lower alkyl group which can be bonded to the α-position of the aforementioned acrylate ester.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is as defined above.

$X^2$ is the same as X1 in general formula (a1-0-1).

$Y^2$ is preferably an alkylene group of 1 to 10 carbon atoms or a divalent aliphatic cyclic group. As the aliphatic cyclic group, the same as those exemplified above in connection with the explanation of "aliphatic cyclic group" can be used, except that two hydrogen atoms have been removed therefrom.

When $Y^2$ represents an alkylene group of 1 to 10 carbon atoms, it is more preferable that the number of carbons is 1 to 6, still more preferably 1 to 4, and most preferably 1 to 3.

When $Y^2$ represents a divalent aliphatic cyclic group, it is particularly desirable that the divalent aliphatic cyclic group be a group in which two or more hydrogen atoms have been removed from cyclopentane, cyclohexane, norbornane, isobornane, adamantane, tricyclodecane or tetracyclododecane.

Specific examples of the structural unit (a1) include structural units represented by general formulas (a1-1) to (a1-4) shown below.

[Chemical Formula 7.]

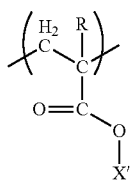
(a1-1)

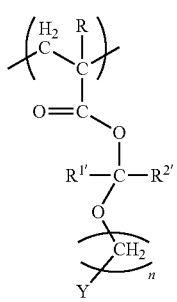
(a1-2)

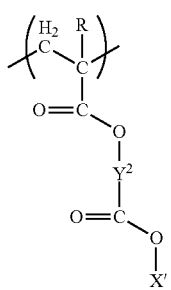
(a1-3)

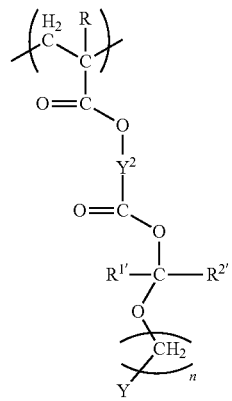
(a1-4)

wherein X' represents a tertiary alkyl ester-type acid dissociable, dissolution inhibiting group; Y represents a lower alkyl group of 1 to 5 carbon atoms or an aliphatic cyclic group; n represents an integer of 0 to 3; $Y^2$ represents an alkylene group or an aliphatic cyclic group; R is as defined above; and $R^{1'}$ and $R^{2'}$ each independently represents a hydrogen atom or a lower alkyl group of 1 to 5 carbon atoms.

Examples of the tertiary alkyl ester-type acid dissociable, dissolution inhibiting group for X' are the same as the above-exemplified tertiary alkyl ester-type acid dissociable, dissolution inhibiting groups for $X^1$.

As $R^{1'}$, $R^{2'}$, n and Y, the same as $R^{1'}$, $R^{2'}$, n and Y defined for general formula (p1) described above in connection with the "acetal-type acid dissociable, dissolution inhibiting group" may be exemplified.

As $Y^2$, the same as $Y^2$ defined for general formula (a1-0-2) above may be exemplified.

Specific examples of structural units represented by general formula (a1-1) to (a1-4) are shown below.

[Chemical Formula 8.]

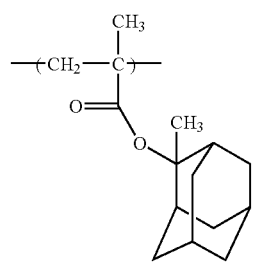
(a1-1-1)

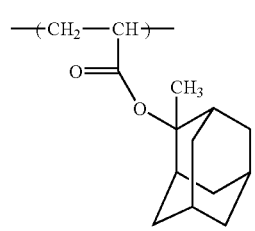
(a1-1-2)

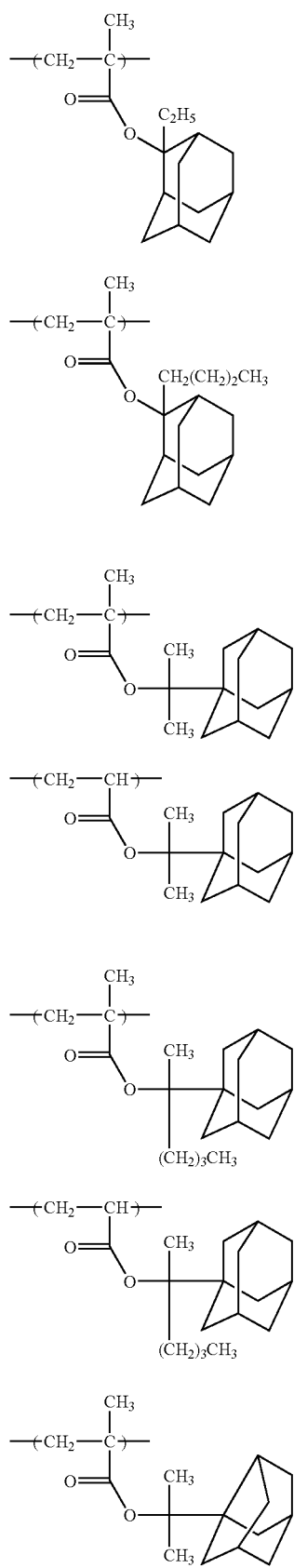
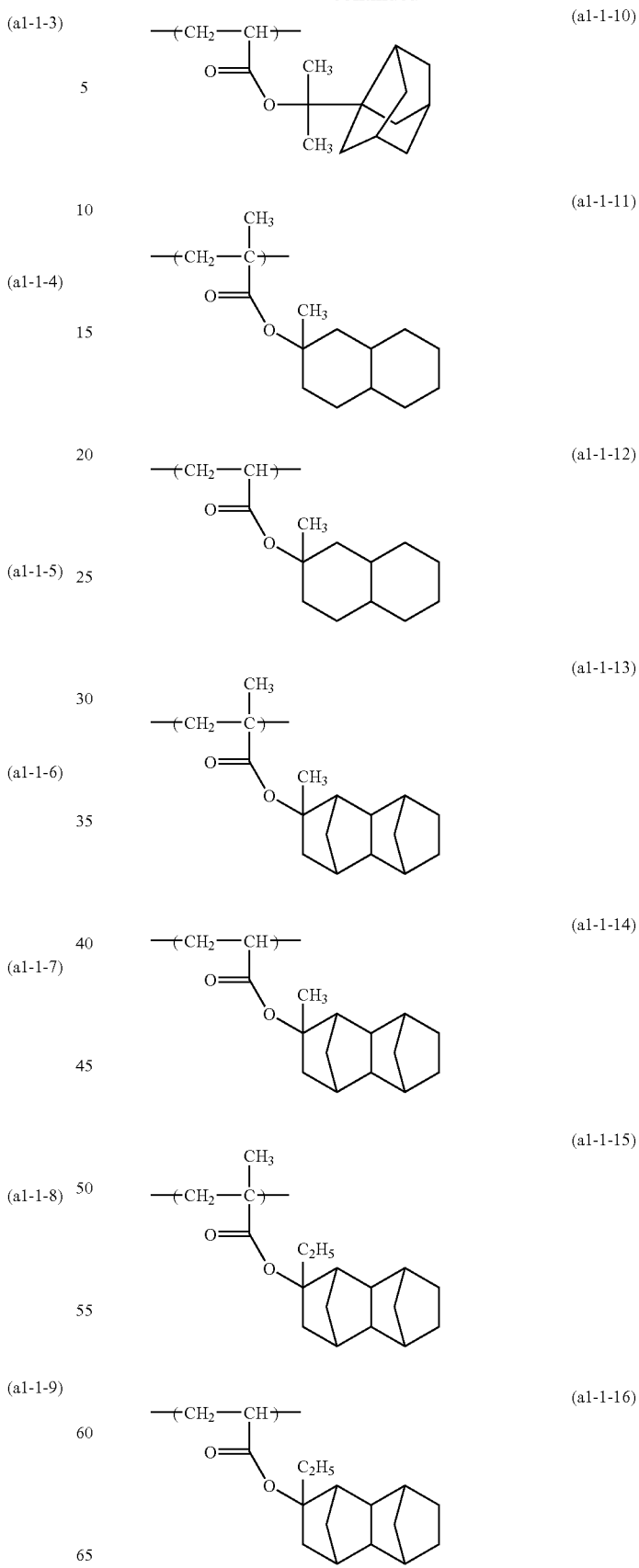

[Chemical Formula 9.]
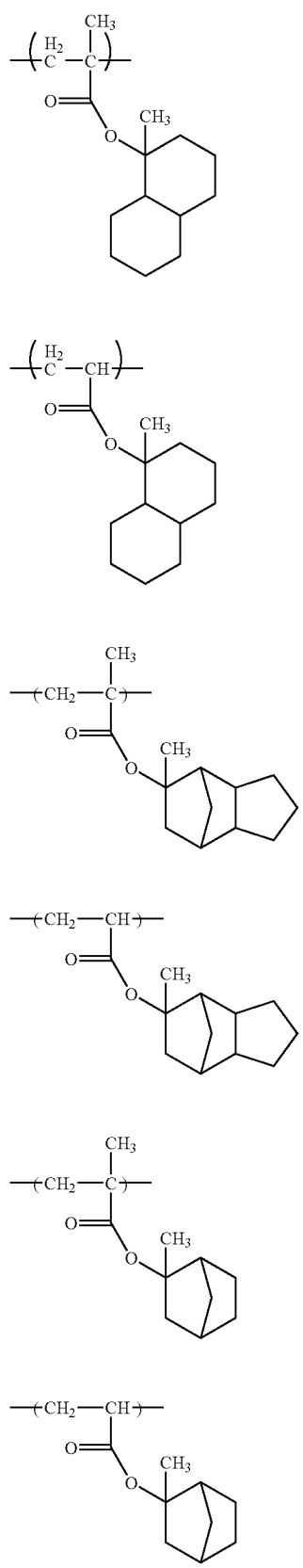
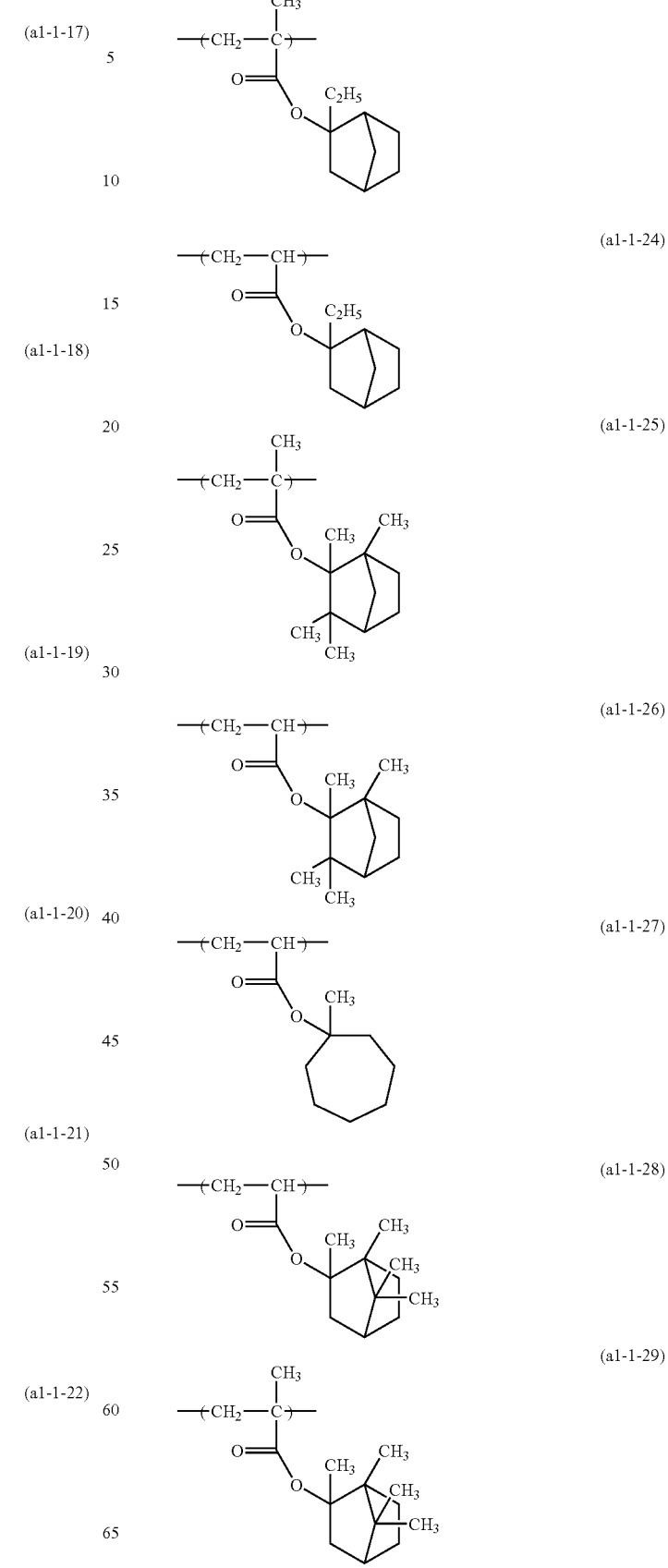

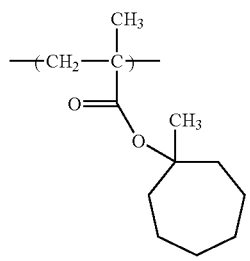
(a1-1-30)
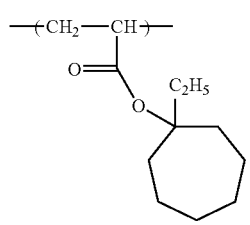
(a1-1-31)
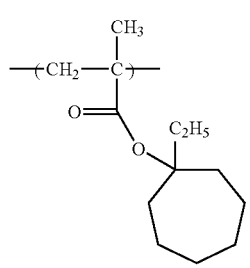
(a1-1-32)
[Chemical Formula 10.]
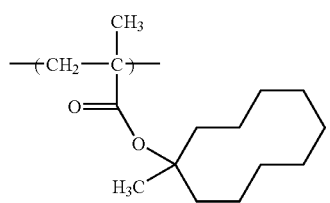
(a1-1-33)
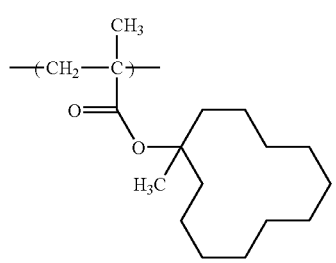
(a1-1-34)
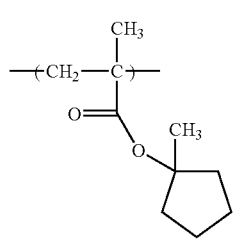
(a1-1-35)
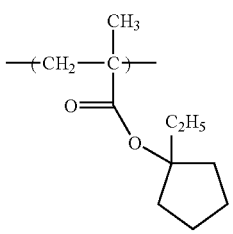
(a1-1-36)
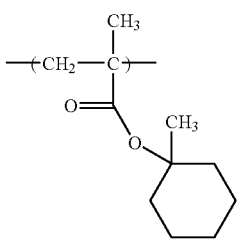
(a1-1-37)
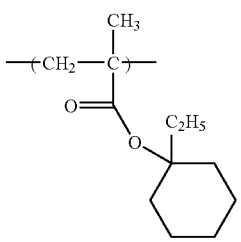
(a1-1-38)
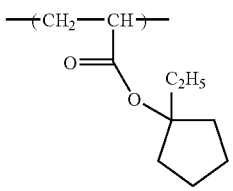
(a1-1-39)
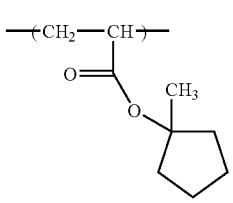
(a1-1-40)
(a1-1-41)
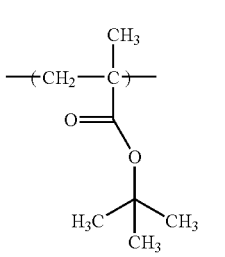
(a1-1-42)

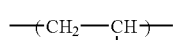 (a1-1-43)
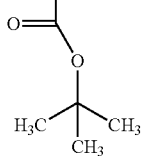 (a1-1-44)
 (a1-1-45)
[Chemical Formula 11.]
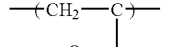 (a1-2-1)
 (a1-2-2)
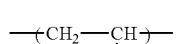 (a1-2-3)
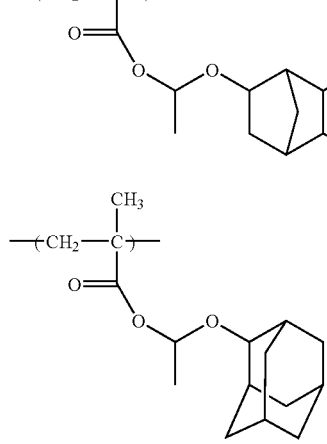 (a1-2-4)
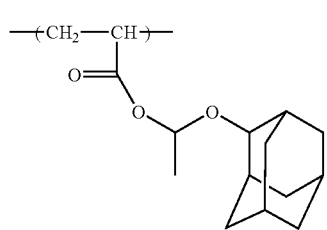
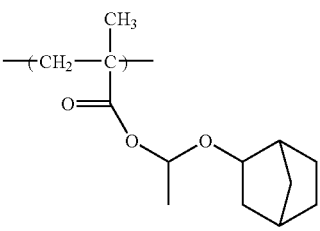 (a1-2-5)
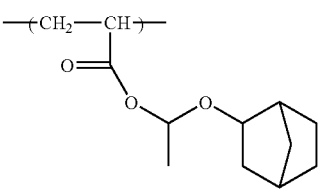 (a1-2-6)
[Chemical Formula 12.]
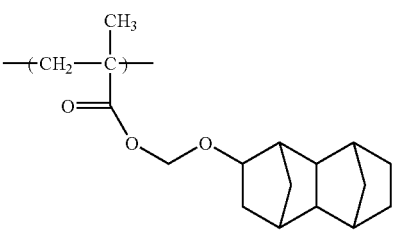 (a1-2-7)
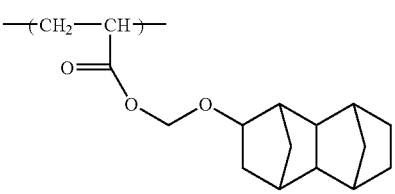 (a1-2-8)
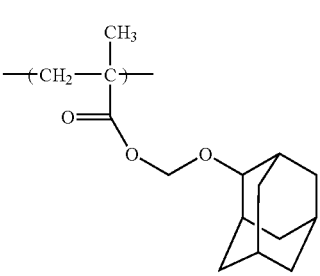 (a1-2-9)
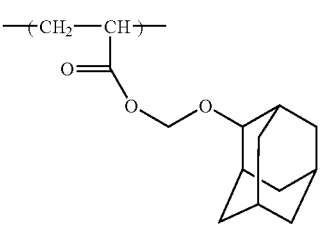 (a1-2-10)
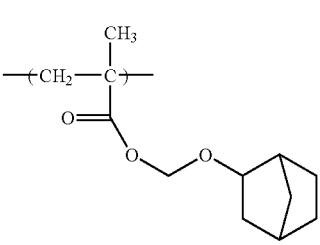 (a1-2-11)

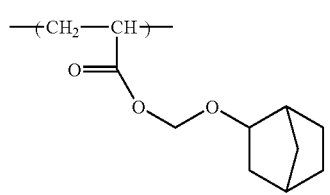 (a1-2-12)
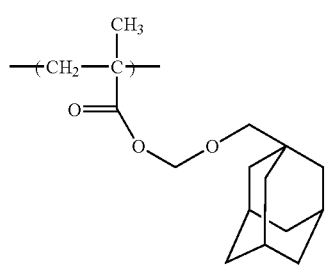 (a1-2-13)
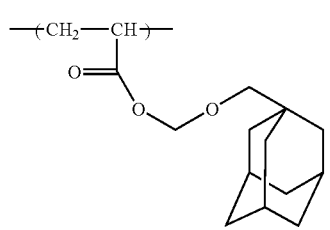 (a1-2-14)
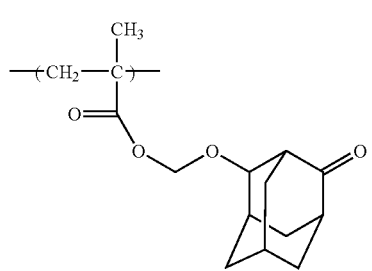 (a1-2-15)
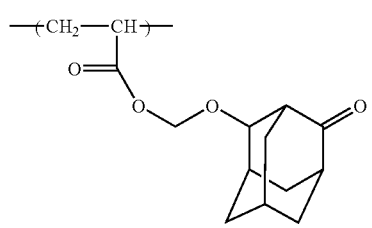 (a1-2-16)
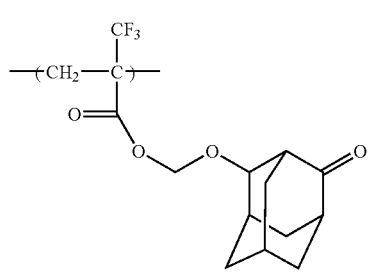 (a1-2-17)
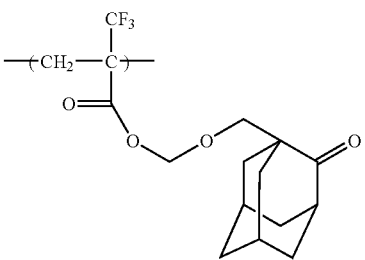 (a1-2-18)
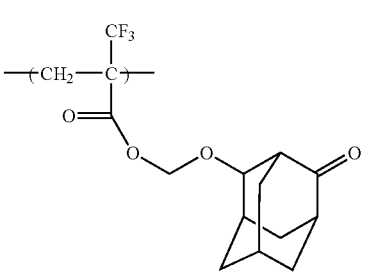 (a1-2-19)
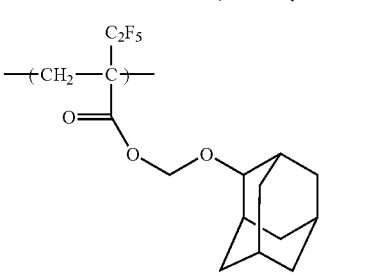 (a1-2-20)
[Chemical Formula 13.]
(a1-2-21)
(a1-2-22)
(a1-2-23)
(a1-2-24)

(a1-2-25) 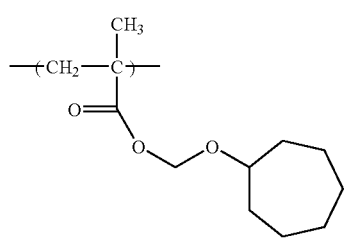
(a1-2-26) 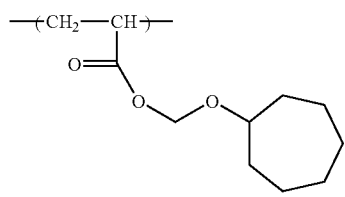
(a1-2-27) 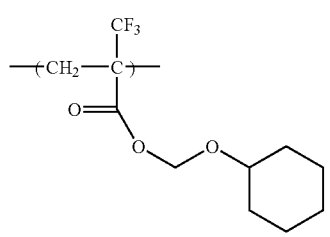
(a1-2-28) 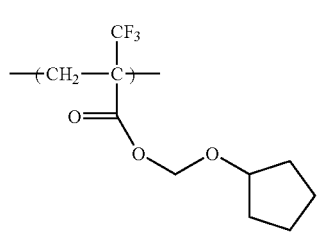
(a1-2-29) 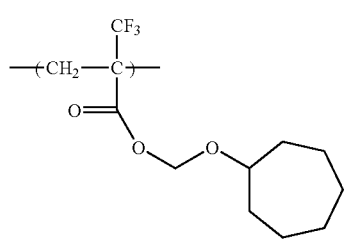
(a1-2-30) 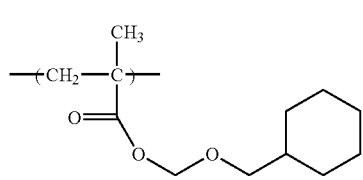
(a1-2-31) 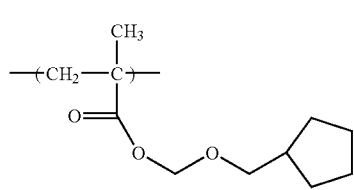
[Chemical Formula 14.]
(a1-2-32) 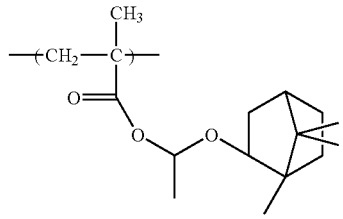
(a1-2-33) 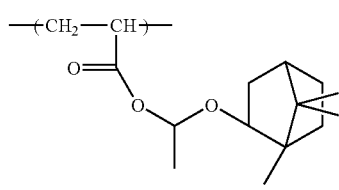
(a1-2-34) 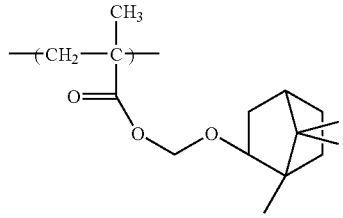
(a1-2-35) 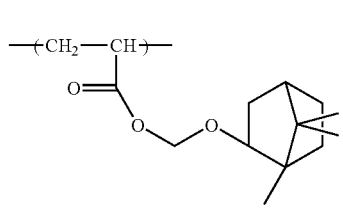
(a1-2-36) 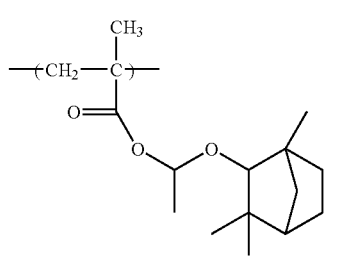
(a1-2-37) 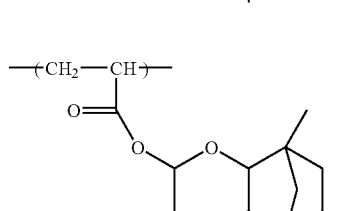
(a1-2-38) 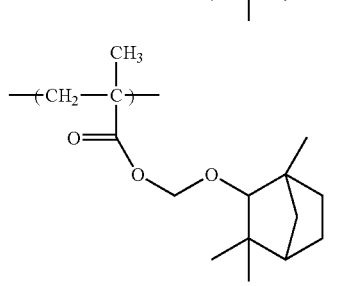

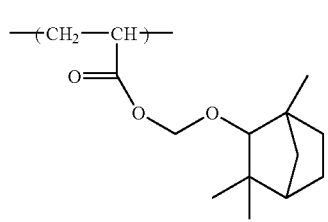 (a1-2-39)
[Chemical Formula 15.]
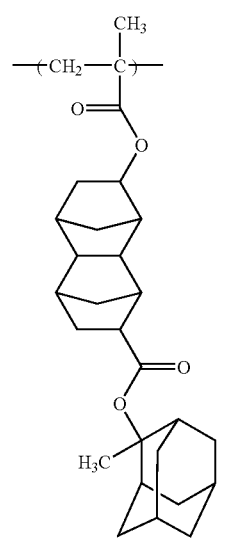 (a1-3-1)
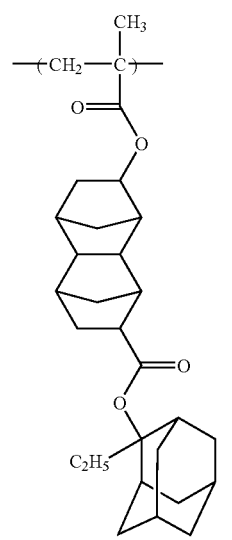 (a1-3-2)
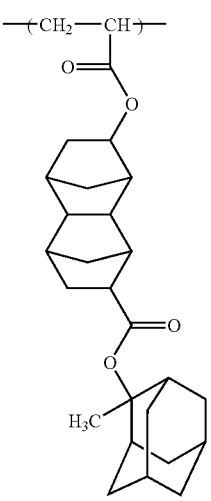 (a1-3-3)
(a1-3-4)
(a1-3-5)
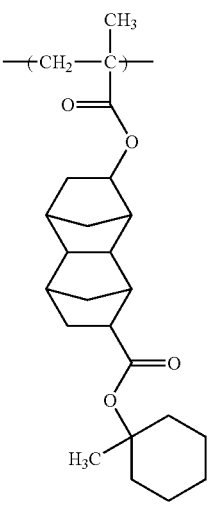

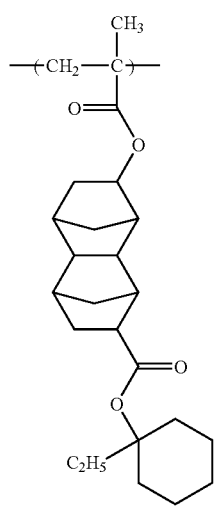
(a1-3-6)
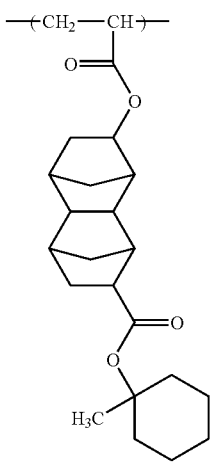
(a1-3-9)
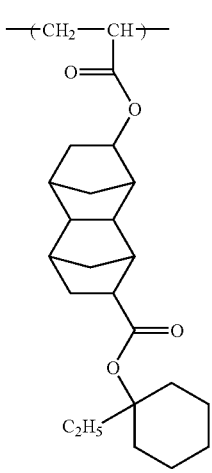
(a1-3-7)
(a1-3-10)
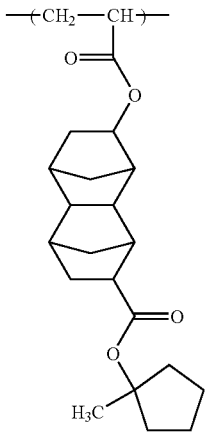
(a1-3-8)
(a1-3-11)

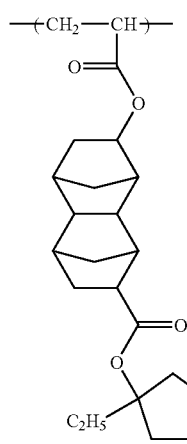 (a1-3-12)
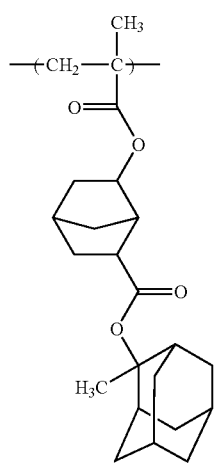 (a1-3-13)
(a1-3-14)
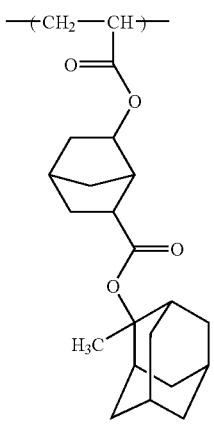 (a1-3-15)
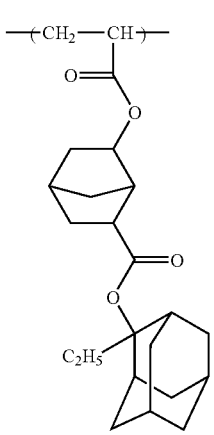 (a1-3-16)
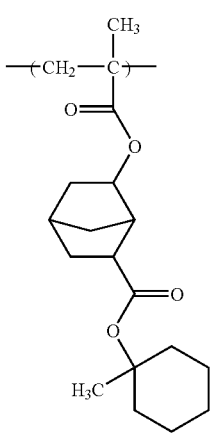 (a1-3-17)
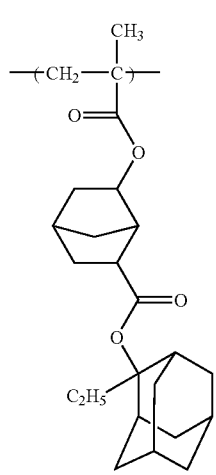

(a1-3-18)
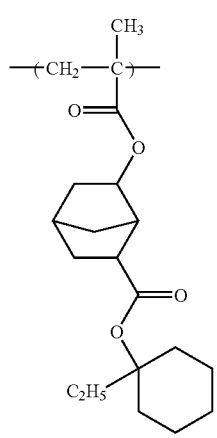
[Chemical Formula 16.]
(a1-3-19)
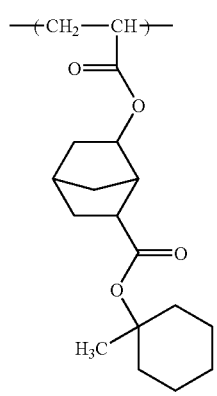
(a1-3-20)
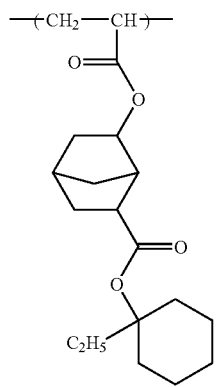
(a1-3-21)
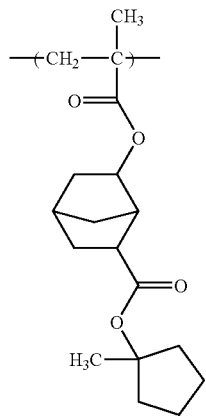
(a1-3-22)
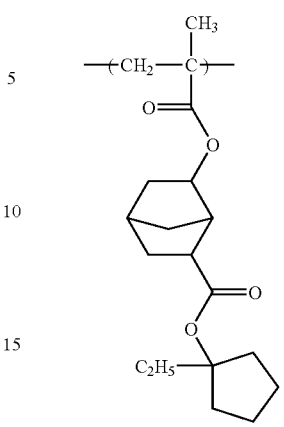
(a1-3-23)
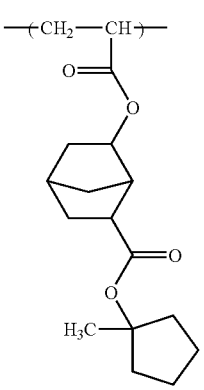
(a1-3-24)
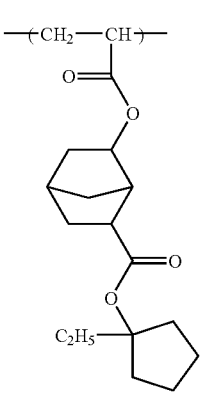
[Chemical Formula 17.]
(a1-3-25)
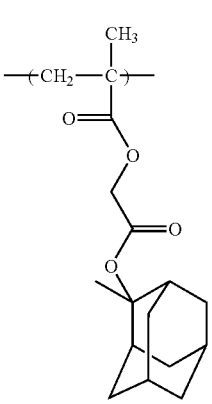

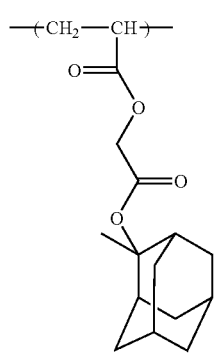 (a1-3-26)
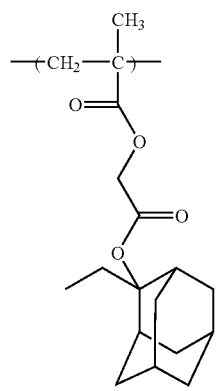 (a1-3-27)
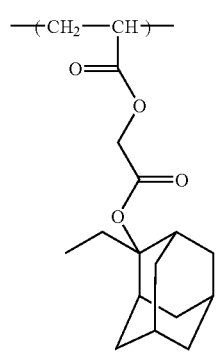 (a1-3-28)
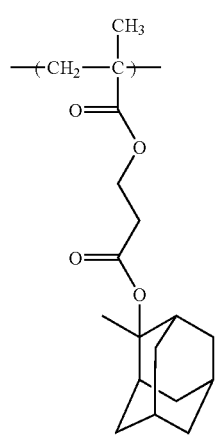 (a1-3-29)
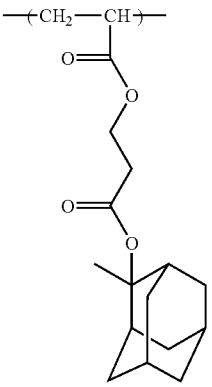 (a1-3-30)
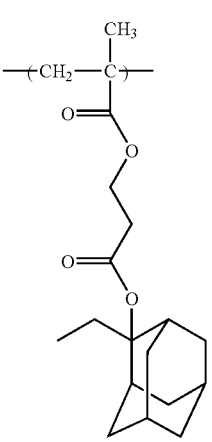 (a1-3-31)
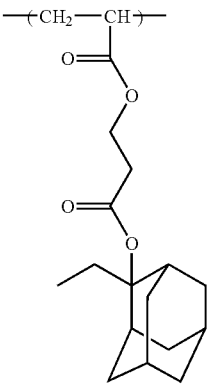 (a1-3-32)
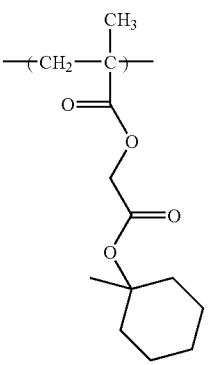 (a1-3-33)

(a1-3-34) 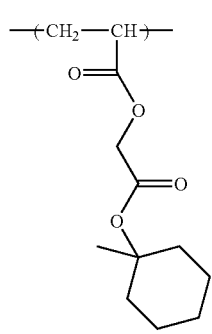
(a1-3-35) 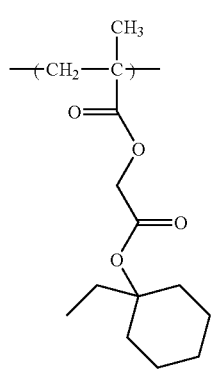
(a1-3-36) 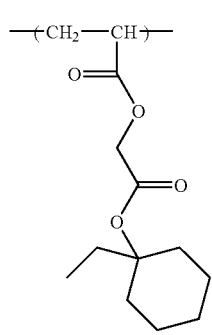
[Chemical Formula 18.]
(a1-3-37) 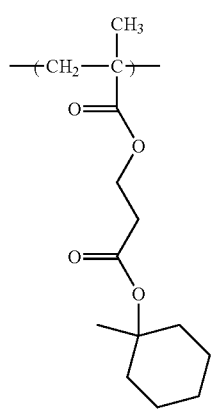
(a1-3-38) 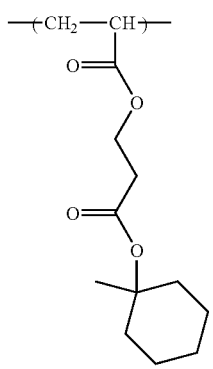
(a1-3-39) 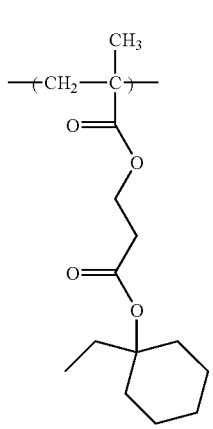
(a1-3-40) 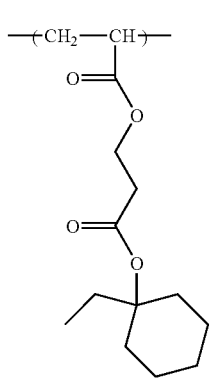
(a1-3-41) 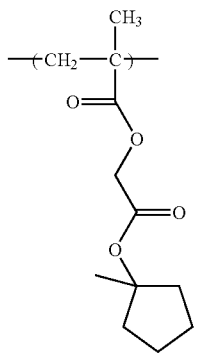

(a1-3-42) 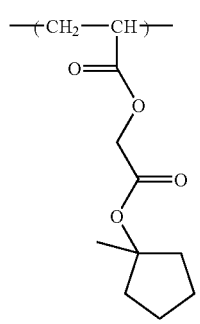
(a1-3-43) 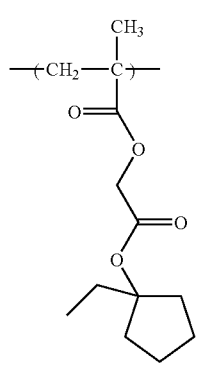
(a1-3-44) 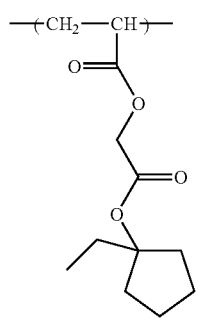
(a1-3-45) 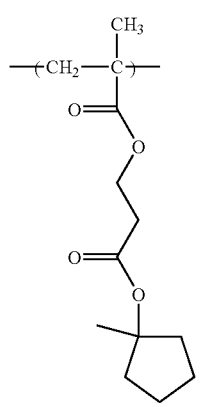
(a1-3-46) 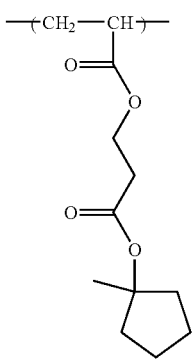
(a1-3-47) 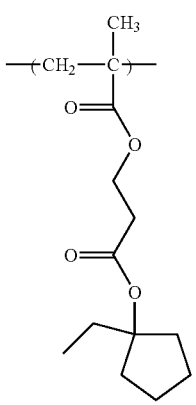
(a1-3-48) 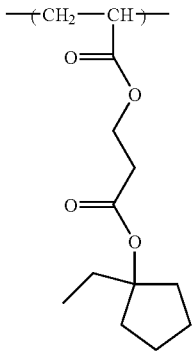
[Chemical Formula 19.]
(a1-4-1) 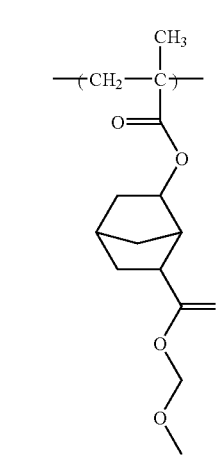

(a1-4-2)
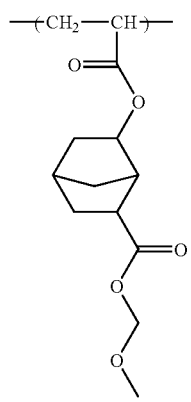
(a1-4-3)
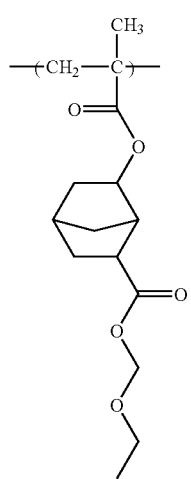
(a1-4-4)
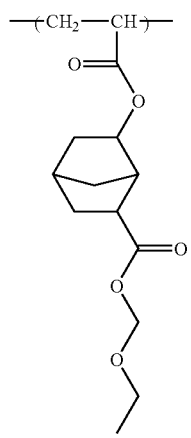
(a1-4-5)
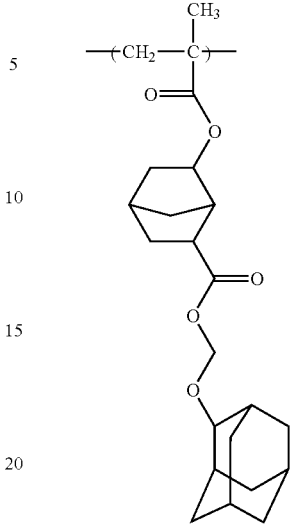
(a1-4-6)
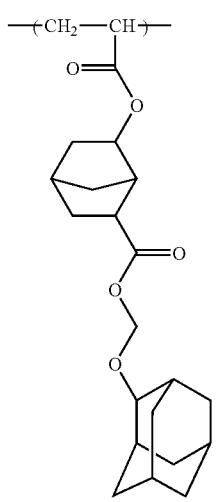
(a1-4-7)
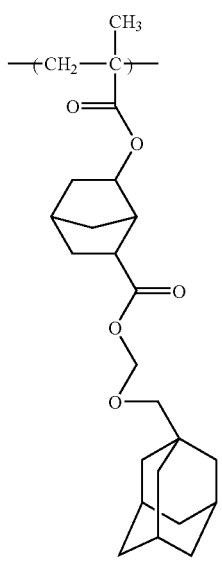

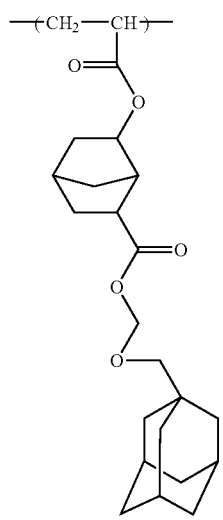
(a1-4-8)
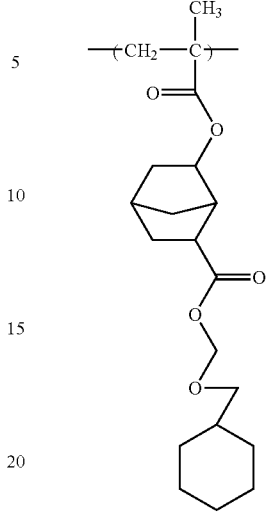
(a1-4-11)
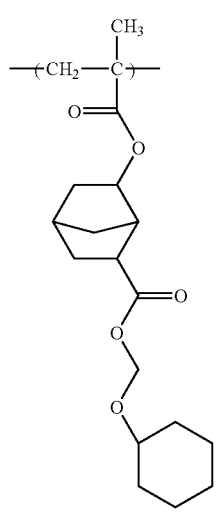
(a1-4-9)
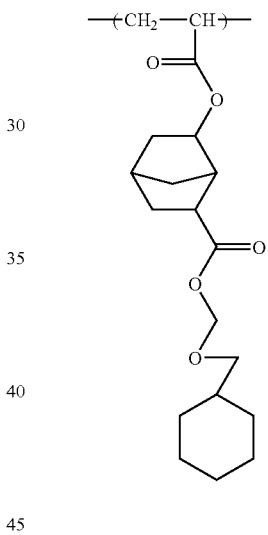
(a1-4-12)
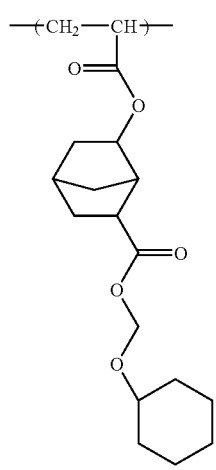
(a1-4-10)
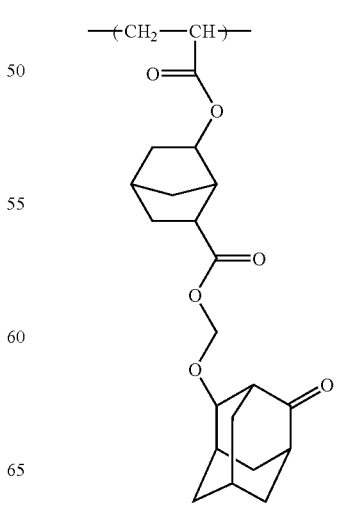
(a1-4-13)

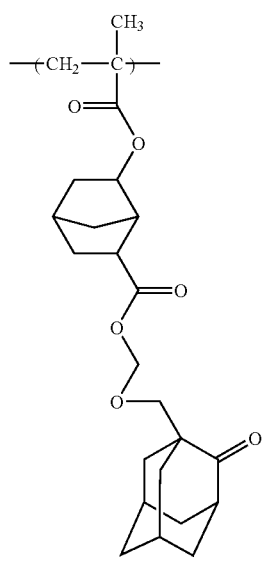
(a1-4-14)
(a1-4-15)
(a1-4-16)
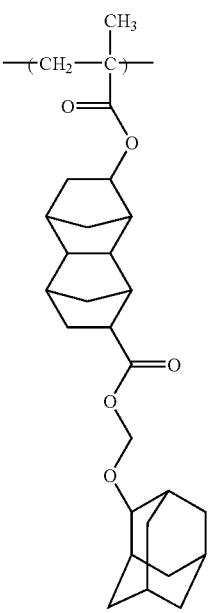
(a1-4-17)
[Chemical Formula 20.]
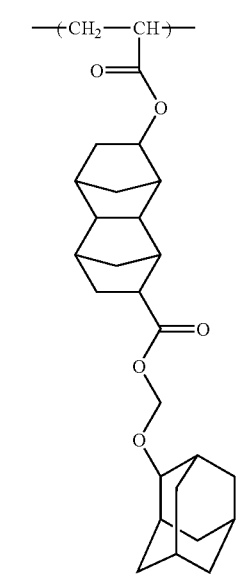
(a1-4-18)

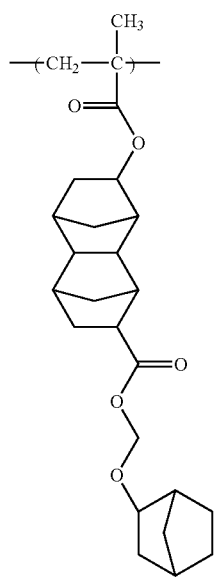
(a1-4-19)
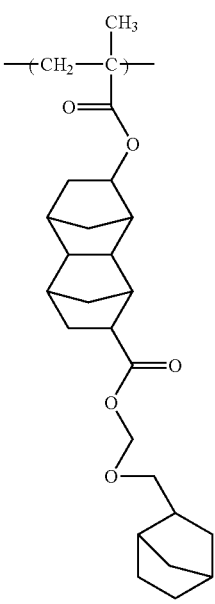
(a1-4-21)
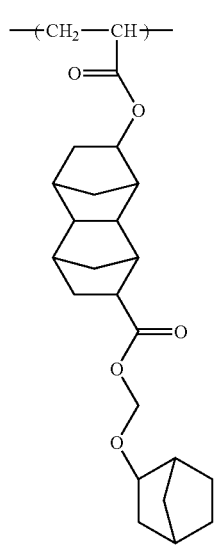
(a1-4-20)
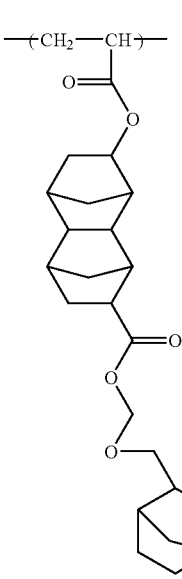
(a1-4-22)

(a1-4-23)
(a1-4-25)
(a1-4-24)
(a1-4-26)
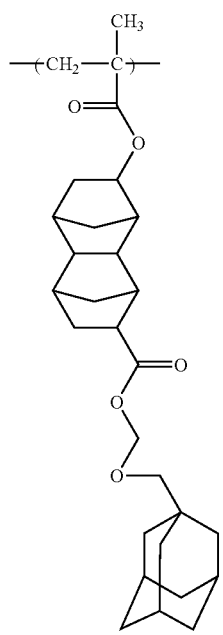
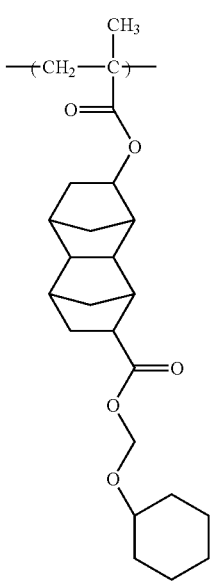

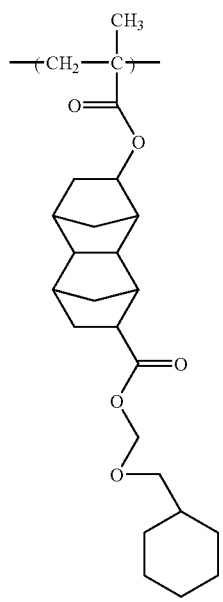
(a1-4-27)

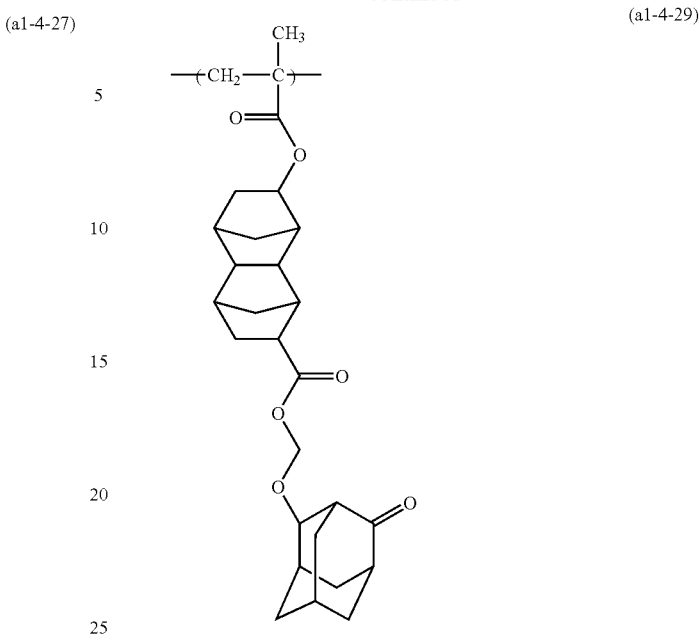
(a1-4-28)
(a1-4-29)
(a1-4-30)

Among these, structural units represented by general formula (a1-1) are preferable. More specifically, at least one structural unit selected from the group consisting of structural units represented by formulas (a1-1-1) to (a-1-1-6) and (a1-1-35) to (a1-1-41) is more preferable.

Further, as the structural unit (a1), structural units represented by general formula (a1-1-01) shown below which includes the structural units represented by formulas (a1-1-1) to (a1-1-4), and structural units represented by general formula (a1-1-02) shown below which includes the structural units represented by formulas (a1-1-35) to (a1-1-41) are also preferable.

[Chemical Formula 21.]

(a1-1-01)

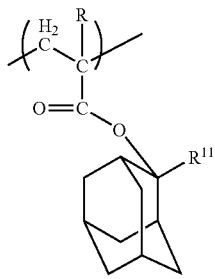

wherein R represents a hydrogen atom, a lower alkyl group or a halogenated lower alkyl group; and $R^{11}$ represents a lower alkyl group.

[Chemical Formula 22.]

(a1-1-02)

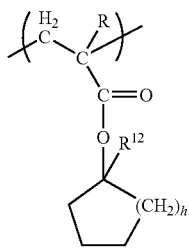

wherein R represents a hydrogen atom, a lower alkyl group or a halogenated lower alkyl group; $R^{12}$ represents a lower alkyl group; and h represents an integer of 1 to 3.

In general formula (a1-1-01), R is as defined above. The lower alkyl group for $R^{11}$ is the same as the lower alkyl group for R above, is preferably a methyl group or an ethyl group, and most preferably an ethyl group.

In general formula (a1-1-02), R is as defined above. The lower alkyl group for $R^{12}$ is the same as the lower alkyl group for R above. $R^{12}$ is preferably a methyl group or an ethyl group, and most preferably an ethyl group. h is preferably 1 to 2, and most preferably 2.

As the structural unit (a1), one type may be used alone, or two or more types may be used in combination.

In the component (A1), the amount of the structural unit (a1) based on the combined total of all structural units constituting the component (A1) is preferably 10 to 80 mol %, more preferably 20 to 70 mol %, and still more preferably 25 to 50 mol %. By making the amount of the structural unit (a1) at least as large as the lower limit of the above-mentioned range, a pattern can be easily formed using a resist composition prepared from the component (A1). On the other hand, by making the amount of the structural unit (a1) no more than the upper limit of the above-mentioned range, a good balance can be achieved with the other structural units.

Structural unit (a2)

The structural unit (a2) is a structural unit derived from an acrylate ester containing a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include groups in which one hydrogen atom has been removed from γ-butyrolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 23.]

(a2-1)

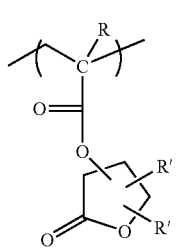

(a2-2)

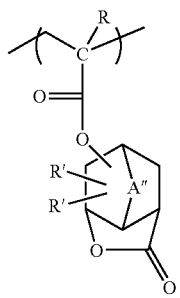

(a2-3)

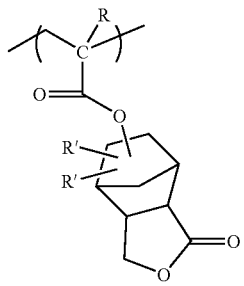

(a2-4)

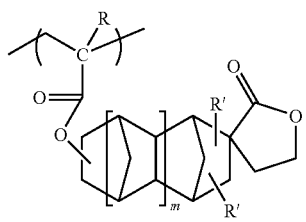

-continued (a2-5)

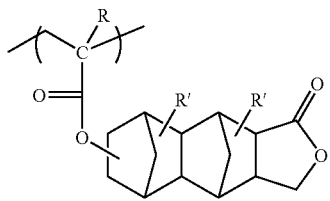

wherein R represents a hydrogen atom, a lower alkyl group or a halogenated lower alkyl group; R' represents a hydrogen atom, a lower alkyl group, an alkoxy group of 1 to 5 carbon atoms or —COOR", wherein R" represents a hydrogen atom or a linear, branched or cyclic alkyl group of 1 to 15 carbon atoms; m represents 0 or 1; and A" represents an alkylene group of 1 to 5 carbon atoms which may contain an oxygen atom or a sulfur atom, an oxygen atom or a sulfur atom.

In general formulas (a2-1) to (a2-5), R is the same as R in the structural unit (a1).

The lower alkyl group for R' is the same as the lower alkyl group for R in the structural unit (a1).

When R" is a linear or branched alkyl group, it preferably has 1 to 10 carbon atoms, more preferably 1 to 5 carbon atoms.

When R" is a cyclic alkyl group, it preferably has 3 to 15 carbon atoms, more preferably 4 to 12 carbon atoms, and most preferably 5 to 10 carbon atoms. Examples thereof include groups in which one or more hydrogen atoms have been removed from a monocycloalkane or a polycycloalkane such as a bicycloalkane, tricycloalkane or tetracycloalkane, and which may or may not be substituted with fluorine atoms or fluorinated alkyl groups. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

In the structural units represented by general formulas (a2-1) to (a2-5), in consideration of industrial availability, R' is preferably a hydrogen atom.

Specific examples of alkylene groups of 1 to 5 carbon atoms for A" include a methylene group, ethylene group, n-propylene group, isopropylene group, —O—CH$_2$—, —CH$_2$—O—CH$_2$—, —S—CH$_2$— and —CH$_2$—S—CH$_2$—.

Specific examples of structural units represented by general formulas (a2-1) to (a2-5) above are shown below.

[Chemical Formula 24.]

(a2-1-1)

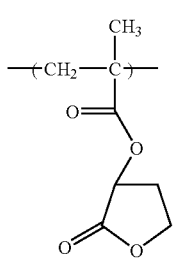

-continued (a2-1-2)

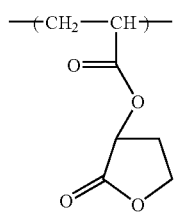

(a2-1-3)

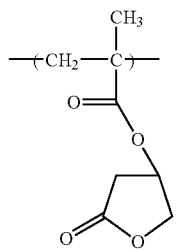

(a2-1-4)

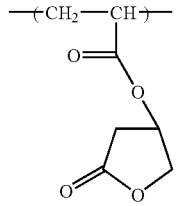

(a2-1-5)

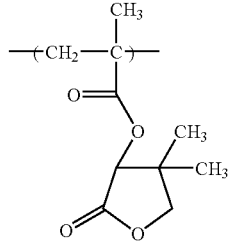

(a2-1-6)

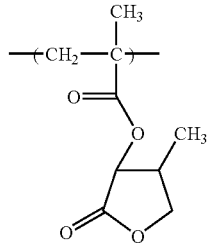

[Chemical Formula 25.]

(a2-2-1)

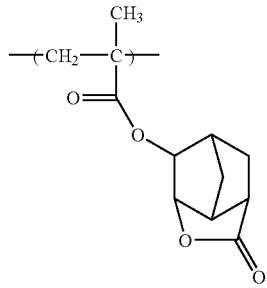

(a2-2-2) 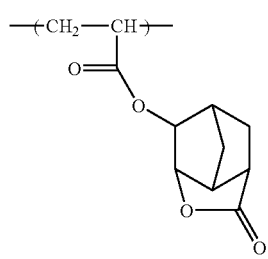
(a2-2-3) 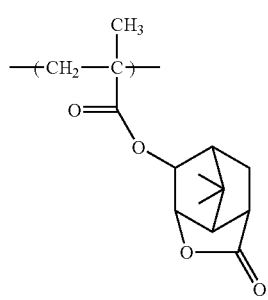
(a2-2-4) 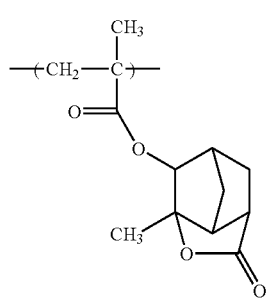
(a2-2-5) 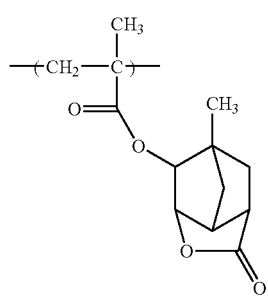
(a2-2-6) 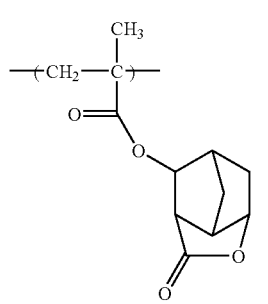
(a2-2-7) 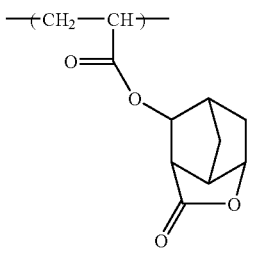
(a2-2-8) 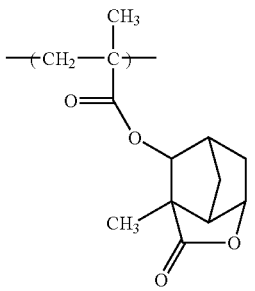
(a2-2-9) 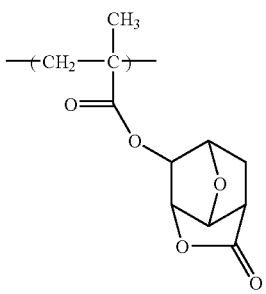
(a2-2-10) 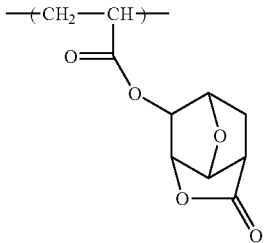
(a2-2-11) 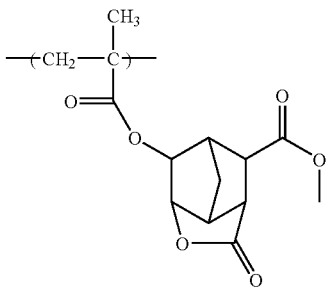
(a2-2-12) 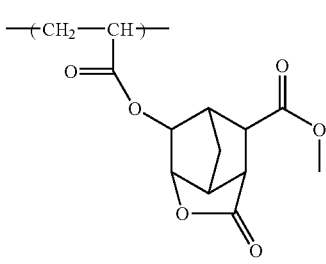

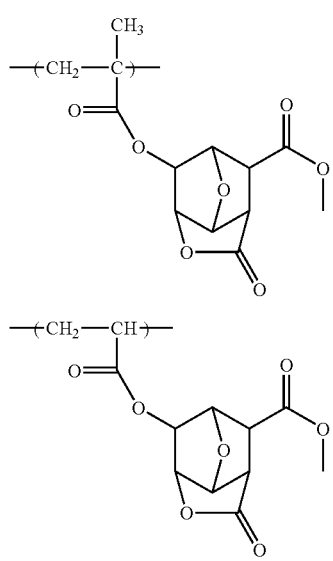 (a2-2-13)
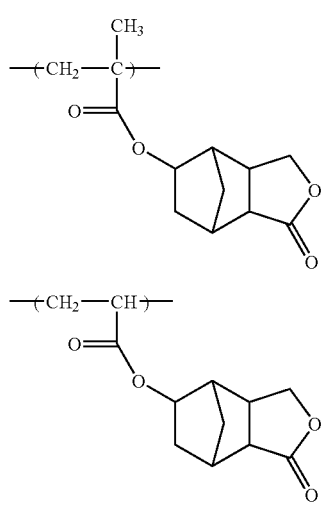 (a2-2-14)
[Chemical Formula 26.]
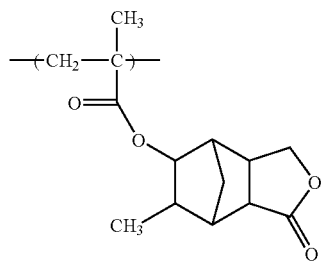 (a2-3-1)
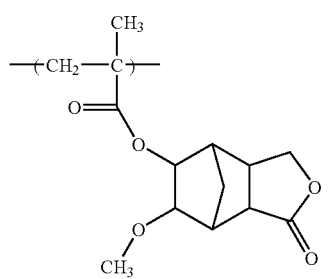 (a2-3-2)
(a2-3-3)
(a2-3-4)
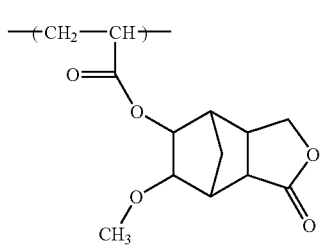 (a2-3-5)
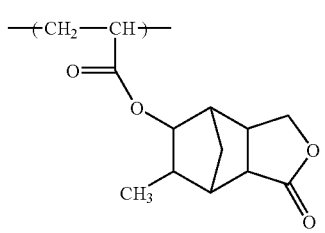 (a2-3-6)
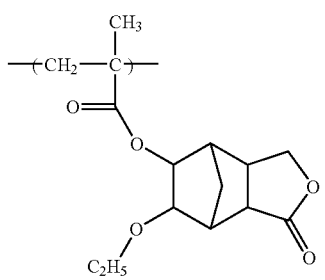 (a2-3-7)
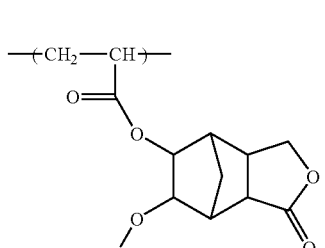 (a2-3-8)
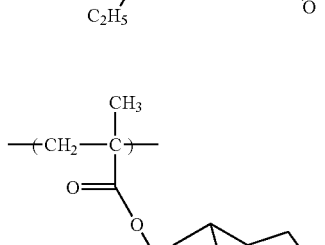 (a2-3-9)
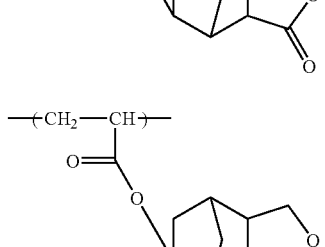 (a2-3-10)

[Chemical Formula 27.]
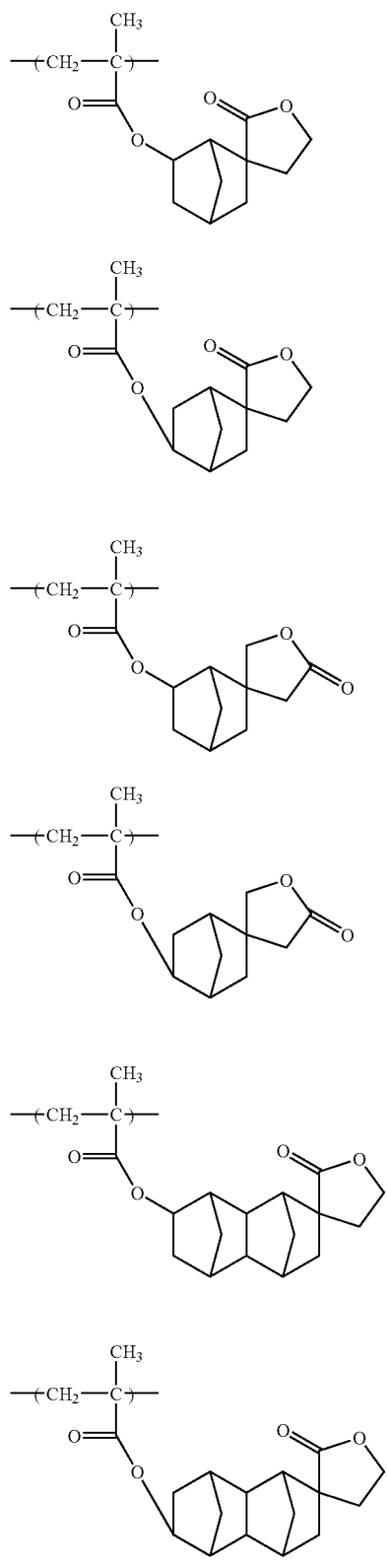
(a2-4-1)
(a2-4-2)
(a2-4-3)
(a2-4-4)
(a2-4-5)
(a2-4-6)
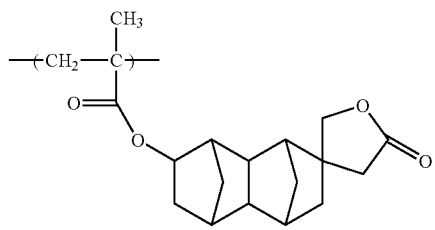
(a2-4-7)
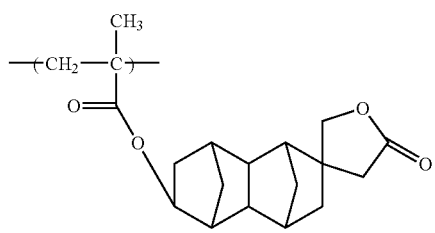
(a2-4-8)
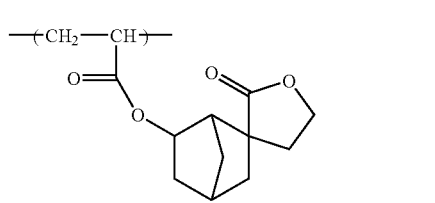
(a2-4-9)
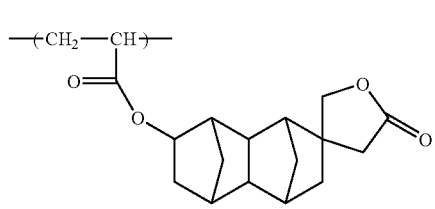
(a2-4-10)
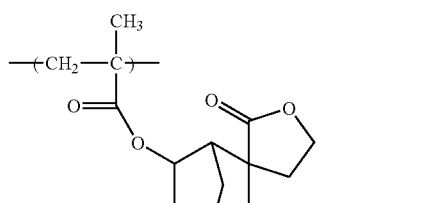
(a2-4-11)
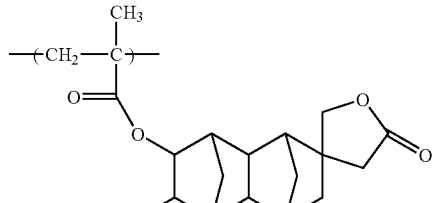
(a2-4-12)
[Chemical Formula 28.]
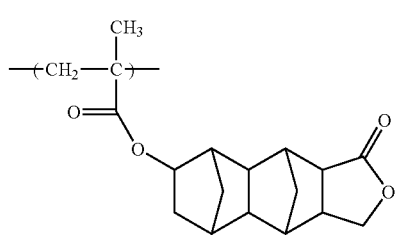
(a2-5-1)

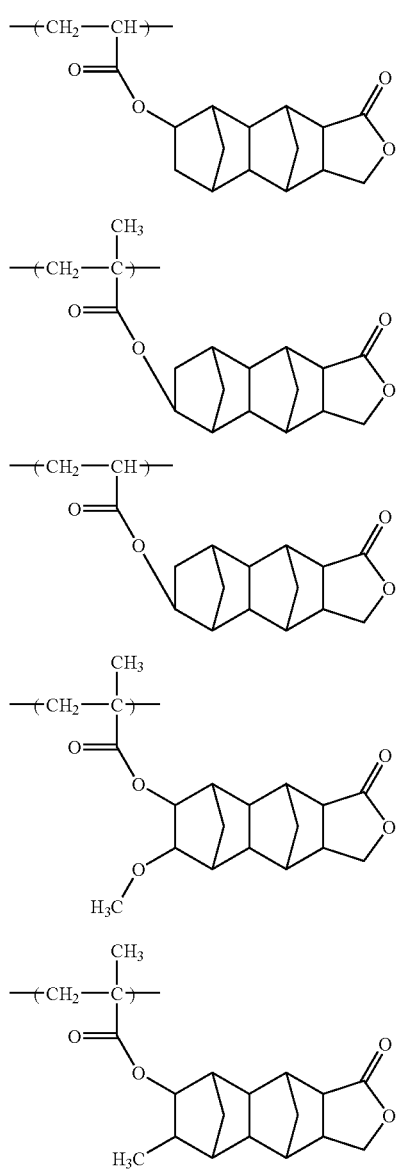

(a2-5-2)

(a2-5-3)

(a2-5-4)

(a2-5-5)

(a2-5-6)

As the structural unit (a2), at least one structural unit selected from the group consisting of formulas (a2-1) to (a2-5) is preferable, and at least one structural unit selected from the group consisting of formulas (a2-1) to (a2-3) is more preferable. Specifically, it is preferable to use at least one structural unit selected from the group consisting of formulas (a2-1-1), (a2-1-2), (a2-2-1), (a2-2-2), (a2-2-9), (a2-2-10), (a2-3-1), (a2-3-2), (a2-3-9) and (a2-3-10), and it is particularly desirable to use at least one structural unit selected from the group consisting of formulas (a2-1-1), (a2-1-2), (a2-2-1) and (a2-2-2).

As the structural unit (a2), one type of structural unit may be used, or two or more types may be used in combination.

In the component (A1), the amount of the structural unit (a2) based on the combined total of all structural units constituting the component (A1) is preferably 5 to 60 mol %, more preferably 10 to 50 mol %, and still more preferably 20 to 50 mol %. By making the amount of the structural unit (a2) at least as large as the lower limit of the above-mentioned range, the effect of using the structural unit (a2) can be satisfactorily achieved. On the other hand, by making the amount of the structural unit (a2) no more than the upper limit of the above-mentioned range, a good balance can be achieved with the other structural units.

Structural unit (a3)

The structural unit (a3) is a structural unit derived from an acrylate ester containing a polar group-containing aliphatic hydrocarbon group.

When the component (A1) includes the structural unit (a3), the hydrophilicity of the component (A1) is improved, and hence, the compatibility of the component (A1) with the developing solution is improved. As a result, the alkali solubility of the exposed portions improves, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that include an aliphatic polycyclic group that contains a hydroxyl group, cyano group, carboxyl group or a hydroxyalkyl group in which some of the hydrogen atoms of the alkyl group have been substituted with fluorine atoms are particularly desirable. Examples of polycyclic groups include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2), and (a3-3) shown below are preferable.

[Chemical Formula 29.]

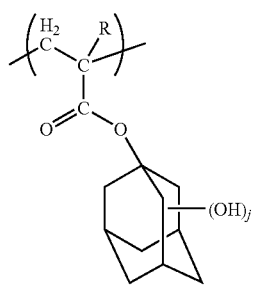

(a3-1)

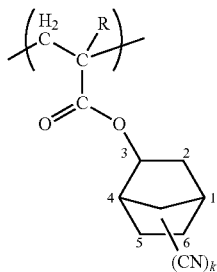
(a3-2)

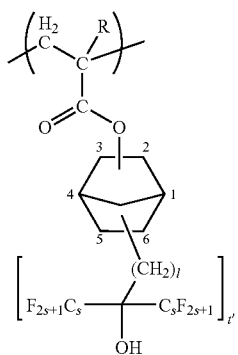
(a3-3)

wherein R is as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 to 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1, l is preferably 1 and s is preferably 1. Further, in formula (a3-3), it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

In the component (A1), as the structural unit (a3), one type of structural unit may be used, or two or more types may be used in combination.

When the component (A1) contains the structural unit (a3), the amount of structural unit (a3) based on the combined total of all structural units constituting the component (A1) is preferably 5 to 50 mol %, more preferably 5 to 40 mol %, and still more preferably 5 to 25 mol %. By making the amount of the structural unit (a3) at least as large as the lower limit of the above-mentioned range, the effect of using the structural unit (a3) can be satisfactorily achieved. On the other hand, by making the amount of the structural unit (a3) no more than the upper limit of the above-mentioned range, a good balance can be achieved with the other structural units.

Structural unit (a4)

The component (A1) may also have a structural unit (a4) which is other than the above-mentioned structural units (a1) to (a3), as long as the effects of the present invention are not impaired.

As the structural unit (a4), any other structural unit which cannot be classified as one of the above structural units (a1) to (a3) can be used without any particular limitations, and any of the multitude of conventional structural units used within resist resins for ArF excimer lasers or KrF excimer lasers (and particularly for ArF excimer lasers) can be used.

As the structural unit (a4), a structural unit which contains a non-acid-dissociable aliphatic polycyclic group, and is also derived from an acrylate ester is preferable. Examples of this polycyclic group include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 30.]

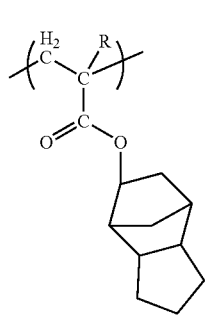
(a4-1)

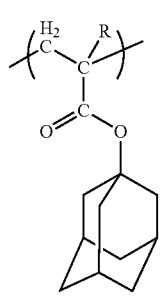
(a4-2)

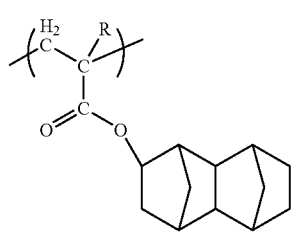
(a4-3)

-continued

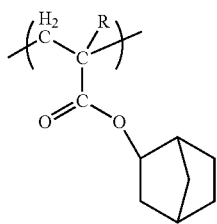
(a4-4)

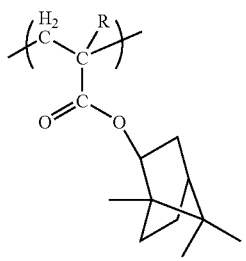
(a4-5)

wherein R is as defined above.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

In the present invention, the component (A1) preferably contains a copolymer having the structural units (a1), (a2) and (a3). Examples of such a copolymer include a copolymer consisting of the structural units (a1) and (a2) and (a3), and a copolymer consisting of the structural units (a1), (a2), (a3) and (a4).

As such a copolymer, a copolymer having a combination of 3 structural units in general formula (A1-11) shown below is preferable.

[Chemical Formula 31.]

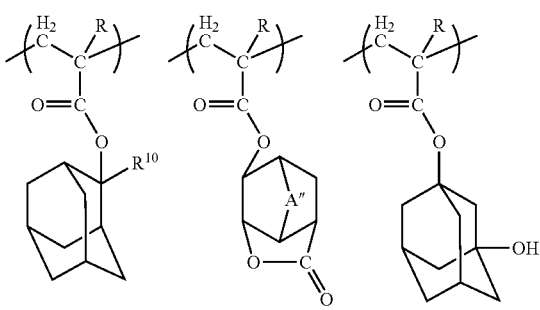
(A1-11)

wherein R and A″ are as defined above, wherein the plurality of R may be the same or different; and $R^{10}$ represents a lower alkyl group.

In formula (A1-11), the lower alkyl group for $R^{10}$ is the same as the lower alkyl group for R, and is preferably a methyl group or an ethyl group, and most preferably an ethyl group.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—$CH_2$—$CH_2$—$CH_2$—$C(CF_3)_2$—OH, a —$C(CF_3)_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

The weight average molecular weight (Mw) (the polystyrene equivalent value determined by gel permeation chromatography) of the component (A1) is not particularly limited, but is preferably 2,000 to 50,000, more preferably 3,000 to 30,000, and most preferably 5,000 to 20,000. By making the weight average molecular weight no more than the upper limit of the above-mentioned range, the component (A1) exhibits satisfactory solubility in a resist solvent when used as a resist. On the other hand, by making the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

[Component (A2)]

As the component (A2), it is preferable to use a compound that has a molecular weight of at least 500 and less than 2,000, contains a hydrophilic group, and also contains an acid dissociable, dissolution inhibiting group exemplified above in connection with the component (A1). Specific examples include compounds containing a plurality of phenol skeletons in which a part of the hydrogen atoms within hydroxyl groups have been substituted with the aforementioned acid dissociable, dissolution-inhibiting groups.

Examples of the component (A2) include low molecular weight phenolic compounds in which a portion of the hydroxyl group hydrogen atoms have been substituted with an aforementioned acid dissociable, dissolution inhibiting group, and these types of compounds are known, for example, as sensitizers or heat resistance improvers for use in non-chemically amplified g-line or i-line resists.

Examples of these low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3', 4'-trihydroxyphenyl)propane, tris(4-hydroxyphenyl) methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl) isopropyl]-4-[1,1-bis(4-hydroxyphenyl)ethyl]benzene, and dimers, trimers and tetramers of formalin condensation products of phenols such as phenol, m-cresol, p-cresol and xylenol. Needless to say, the low molecular weight phenol compound is not limited to these examples.

Also, there are no particular limitations on the acid dissociable, dissolution inhibiting group, and suitable examples include the groups described above.

As the component (A), one type may be used, or two or more types may be used in combination.

It is preferable that the component (A) be the aforementioned component (A'), and it is particularly desirable that the component (A') contain the component (A1).

In the resist composition of the present invention, the amount of the component (A) can be appropriately adjusted depending on the thickness of the resist film to be formed, and the like.

<Component (B)>

As the component (B), there is no particular limitation, and any of the known acid generators used in conventional chemically amplified resist compositions can be used.

Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As an onium salt-based acid generator a compound represented by general formula (b-1) or (b-2) shown below can be preferably used.

[Chemical Formula 32.]

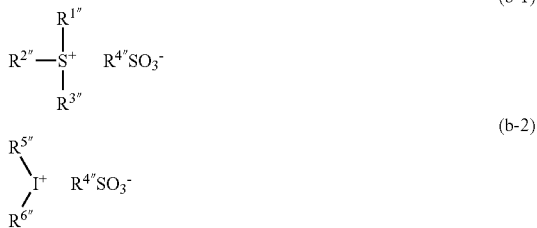

wherein $R^{1\prime\prime}$ to $R^{3\prime\prime}$, $R^{5\prime\prime}$ and $R^{6\prime\prime}$ each independently represents an aryl group or alkyl group, wherein two of $R^{1\prime\prime}$ to $R^{3\prime\prime}$ in formula (b-1) may be bonded to each other to form a ring with the sulfur atom; and $R^{4\prime\prime}$ represents a linear, branched or cyclic alkyl group or fluorinated alkyl group, with the proviso that at least one of $R^{1\prime\prime}$ to $R^{3\prime\prime}$ represents an aryl group, and at least one of $R^{5\prime\prime}$ and $R^{6\prime\prime}$ represents an aryl group.

In formula (b-1), $R^{1\prime\prime}$ to $R^{3\prime\prime}$ each independently represents an aryl group or an alkyl group. In formula (b-1), two of $R^{1\prime\prime}$ to $R^{3\prime\prime}$ in formula (b-1) may be bonded to each other to form a ring with the sulfur atom.

Further, among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly desirable that all of $R^{1\prime\prime}$ to $R^{3\prime\prime}$ are aryl groups.

The aryl group for $R^{1\prime\prime}$ to $R^{3\prime\prime}$ is not particularly limited. For example, an aryl group having 6 to 20 carbon atoms may be used in which some or all of the hydrogen atoms of the aryl group may or may not be substituted with alkyl groups, alkoxy groups, halogen atoms or hydroxyl groups.

The aryl group is preferably an aryl group having 6 to 10 carbon atoms because it can be synthesized at a low cost. Specific examples thereof include a phenyl group and naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and most preferably a methoxy group, ethoxy group, n-propoxy group, iso-propoxy group, n-butoxy group or tert-butoxy group.

The alkoxy group, with which hydrogen atoms of the aryl group may be substituted, is preferably an alkoxy group having 1 to 5 carbon atoms, and most preferably a methoxy group or an ethoxy group The halogen atom, with which hydrogen atoms of the aryl group may be substituted, is preferably a fluorine atom.

The alkyl group for $R^{1\prime\prime}$ to $R^{3\prime\prime}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

It is particularly desirable that each of $R^{1\prime\prime}$ to $R^{3\prime\prime}$ is a phenyl group or a naphthyl group.

When two of $R^{1\prime\prime}$ to $R^{3\prime\prime}$ in formula (b-1) are bonded to each other to form a ring with the sulfur atom, it is preferable that the two of $R^{1\prime\prime}$ to $R^{3\prime\prime}$ form a 3 to 10-membered ring including the sulfur atom, and it is particularly desirable that the two of $R^{1\prime\prime}$ to $R^{3\prime\prime}$ form a 5 to 7-membered ring including the sulfur atom. When two of $R^{1\prime\prime}$ to $R^{3\prime\prime}$ in formula (b-1) are bonded to each other to form a ring with the sulfur atom, the remaining one of $R^{1\prime\prime}$ to $R^{3\prime\prime}$ is preferably an aryl group. As examples of the aryl group, the same aryl groups as those for $R^{1\prime\prime}$ to $R^{3\prime\prime}$ can be mentioned.

$R^{4\prime\prime}$ represents a linear, branched or cyclic alkyl or fluorinated alkyl group.

The linear or branched alkyl group preferably has 1 to 10 carbon atoms, more preferably 1 to 8 carbon atoms, and most preferably 1 to 4 carbon atoms.

The cyclic alkyl group is preferably a cyclic group, as described for $R^{1\prime\prime}$, having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. Further, the fluorination ratio of the fluorinated alkyl group (percentage of fluorine atoms within the alkyl group) is preferably from 10 to 100%, more preferably from 50 to 100%, and a fluorinated alkyl group in which all hydrogen atoms are substituted with fluorine atoms (i.e., a perfluoroalkyl group) is particularly desirable because the acid strength increases.

$R^{4\prime\prime}$ is most preferably a linear or cyclic alkyl group or fluorinated alkyl group.

In formula (b-2), $R^{5\prime\prime}$ and $R^{6\prime\prime}$ each independently represents an aryl group or alkyl group. At least one of $R^{5\prime\prime}$ and $R^{6\prime\prime}$ represents an aryl group. It is preferable that both of $R^{5\prime\prime}$ and $R^{6\prime\prime}$ represent an aryl group.

As the aryl group for $R^{5\prime\prime}$ and $R^{6\prime\prime}$, the same aryl groups as those for $R^{1\prime\prime}$ to $R^{3\prime\prime}$ can be mentioned.

As the alkyl group for $R^{5\prime\prime}$ and $R^{6\prime\prime}$, the same alkyl groups as those for $R^{1\prime\prime}$ to $R^{3\prime\prime}$ can be mentioned.

It is particularly desirable that both of $R^{5\prime\prime}$ and $R^{6\prime\prime}$ represent a phenyl group.

As $R^{4\prime\prime}$ in formula (b-2), the same as those mentioned above for $R^{4\prime\prime}$ in formula (b-1) can be mentioned.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate. It is also possible to use onium salts in which the anion moiety of these onium salts are replaced by methanesulfonate, n-propanesulfonate, n-butanesulfonate, or n-octanesulfonate.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may be used.

[Chemical Formula 33.]

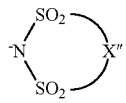
(b-3)

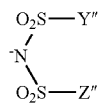
(b-4)

wherein X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved. The amount of fluorine atoms within the alkylene group or alkyl group, i.e., fluorination ratio, is preferably from 70 to 100%, more preferably from 90 to 100%, and it is particularly desirable that the alkylene group or alkyl group be a perfluoroalkylene or perfluoroalkyl group in which all hydrogen atoms are substituted with fluorine atoms.

Further, onium salt-based acid generators in which the anion moiety in general formula (b-1) or (b-2) is replaced by an anion moiety represented by general formula (b-7) shown below (wherein the cation moiety is the same as (b-1) or (b-2)) may be used.

[Chemical Formula 34.]

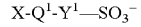
(b-7)

wherein $Q^1$ represents a divalent linkage group containing an oxygen atom; $Y^1$ represents an alkylene group of 1 to 4 carbon atoms which may have a substituent or a fluorinated alkylene group of 1 to 4 carbon atoms which may have a substituent; and X represents a hydrocarbon group of 3 to 30 carbon atoms which may have a substituent.

In general formula (b-7), $Q^1$ represents a divalent linkage group containing an oxygen atom.

$Q^1$ may contain an atom other than an oxygen atom. Examples of atoms other than an oxygen atom include a carbon atom, a hydrogen atom, a sulfur atom and a nitrogen atom.

Examples of divalent linkage groups containing an oxygen atom include non-hydrocarbon, oxygen atom-containing linkage groups such as an oxygen atom (an ether bond; —O—), an ester bond (—C(=O)—O—), an amido bond (—C(=O)—NH—), a carbonyl group (—C(=O)—) and a carbonate group (—O—C(=O)—O—); and combinations of the aforementioned non-hydrocarbon, hetero atom-containing linkage groups with an alkylene group.

Specific examples of the combinations of the aforementioned non-hydrocarbon, hetero atom-containing linkage groups and an alkylene group include —$R^{91}$—O— and —$R^{92}$—O—C(=O)— (wherein each of $R^{91}$ and $R^{92}$ independently represents an alkylene group).

The alkylene group is preferably a linear or branched alkylene group, and preferably has 1 to 12 carbon atoms, more preferably 1 to 5, and most preferably 1 to 3.

Specific examples of alkylene groups include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$; an ethylene group [—$CH_2CH_2$—]; alkylethylene groups such as —CH($CH_3$)$CH_2$—, —CH($CH_3$)CH($CH_3$)—, —C($CH_3$)$_2CH_2$—, and —CH($CH_2CH_3$)$CH_2$—; a trimethylene group (n-propylene group) [—$CH_2CH_2CH_2$—]; alkyltrimethylene groups such as —CH($CH_3$)$CH_2CH_2$— and —$CH_2$CH($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—].

As $Q^1$, a divalent linkage group containing an ester bond or an ether bond is preferable, more preferably an ester bond, an ether bond, —$R^{91}$—O— or —$R^{92}$—O—C(=O)—, and an ester bond is particularly desirable.

In general formula (b-7), as the alkylene group for $Y^1$, the same alkylene groups as those mentioned above for $Q^1$ which have 1 to 4 carbon atoms can be used.

As the fluorinated alkylene group for $Y^1$, the aforementioned alkylene group in which a part or all of the hydrogen atoms have been substituted with fluorine atoms can be used.

Specific examples of $Y^1$ include —$CF_2$—, —$CF_2CF_2$—, —$CF_2CF_2CF_2$—, —CF($CF_3$)$CF_2$—, —CF($CF_2CF_3$)—, —C($CF_3$)$_2$—, —$CF_2CF_2CF_2CF_2$—, —CF($CF_3$)$CF_2CF_2$—, —$CF_2$CF($CF_3$)$CF_2$—, —CF($CF_3$)CF($CF_3$)—, —C($CF_3$)$_2CF_2$—, —CF($CF_2CF_3$)$CF_2$—, —CF($CF_2CF_2CF_3$)—, —C($CF_3$)($CF_2CF_3$)—; —CHF—, —$CH_2CF_2$—, —$CH_2CH_2CF_2$—, —$CH_2CF_2CF_2$—, —CH($CF_3$)$CH_2$—, —CH($CF_2CF_3$)—, —C($CH_3$)($CF_3$)—, —$CH_2CH_2CH_2CF_2$—, —$CH_2CH_2CF_2CF_2$—, —CH($CF_3$)$CH_2CH_2$—, —$CH_2$CH($CF_3$)$CH_2$—, —CH($CF_3$)CH($CF_3$)—, —C($CF_3$)$_2CH_2$—; —$CH_2$—, —$CH_2CH_2$—, —$CH_2CH_2CH_2$—, —CH($CH_3$)$CH_2$—, —CH($CH_2CH_3$)—, —C($CH_3$)$_2$—, —$CH_2CH_2CH_2CH_2$—, —CH($CH_3$)$CH_2CH_2$—, —$CH_2$CH($CH_3$)$CH_2$—, —CH($CH_3$)CH($CH_3$)—, —C($CH_3$)$_2CH_2$—, —CH($CH_2CH_3$)$CH_2$—, —CH($CH_2CH_2CH_3$)—, and —C($CH_3$)($CH_2C_3$)—.

As $Y^1$, a fluorinated alkylene group is preferable, and a fluorinated alkylene group in which the carbon atom bonded to the adjacent sulfur atom is fluorinated is particularly desirable. Examples of such fluorinated alkylene groups include —$CF_2$—, —$CF_2CF_2$—, —$CF_2CF_2CF_2$—, —CF($CF_3$)$CF_2$—, —$CF_2CF_2CF_2CF_2$—, —CF($CF_3$)$CF_2CF_2$—, —$CF_2$CF($CF_3$)$CF_2$—, —CF($CF_3$)CF($CF_3$)—, —C($CF_3$)$_2CF_2$—, —CF($CF_2CF_3$)$CF_2$—; —$CH_2CF_2$—, —$CH_2CH_2CF_2$—, —$CH_2CF_2CF_2$—; —$CH_2CH_2CH_2CF_2$—, —$CH_2CH_2CF_2CF_2$—, and —$CH_2CF_2CF_2CF_2$—.

Among these, —$CF_2$—, —$CF_2CF_2$—, —$CF_2CF_2CF_2$—, and $CH_2CF_2CF_2$— are preferable, —$CF_2$—, —$CF_2CF_2$— and —$CF_2CF_2CF_2$— are more preferable, and —$CF_2$— is particularly desirable.

The aforementioned alkylene group or fluorinated alkylene group may have a substituent. When an alkylene group or a fluorinated alkylene group "has a substituent", it means that a part or all of the hydrogen atoms or fluorine atoms of the alkylene group or fluorinated alkylene group have been substituted with an atom or a group other than a hydrogen atom and a fluorine atom.

Examples of substituents which the alkylene group or fluorinated alkylene group may have include an alkyl group of 1 to 4 carbon atoms, an alkoxy group of 1 to 4 carbon atoms and a hydroxyl group.

In general formula (b-7), the hydrocarbon group for X may be either an aromatic hydrocarbon group or an aliphatic hydrocarbon group.

An aromatic hydrocarbon group is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 to 2, and most preferably 1.

The aromatic hydrocarbon group may have a substituent. For example, a part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which a part of the carbon atoms constituting the ring within the aforementioned aryl group has been substituted with a hetero atom such as an oxygen atom, a sulfur atom or a nitrogen atom, and a heteroarylalkyl group in which a part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which a part or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be linear, branched or cyclic.

In the aliphatic hydrocarbon group for X, a part of the carbon atoms constituting the aliphatic hydrocarbon group may be substituted with a substituent group containing a hetero atom, or a part or all of the hydrogen atoms constituting the aliphatic hydrocarbon group may be substituted with a substituent group containing a hetero atom.

As the "hetero atom" for X, there is no particular limitation as long as it is an atom other than a carbon atom and a hydrogen atom. Examples of hetero atoms include a halogen atom, an oxygen atom, a sulfur atom and a nitrogen atom.

Examples of halogen atoms include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting a part of the carbon atoms include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain these substituent groups in the ring structure.

Examples of the substituent group for substituting a part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5, still more preferably 2 to 4, and most preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L5) and (S1) to (S4) shown below.

[Chemical Formula 35.]

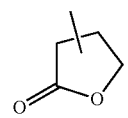

(L1)

(L2)

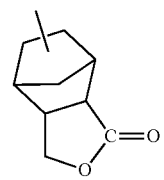

(L3)

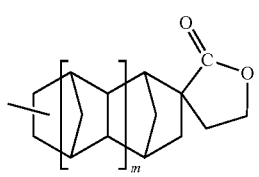
(L4)

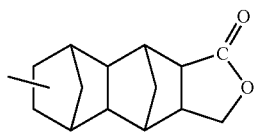
(L5)

(S1)

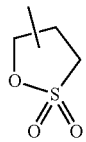
(S2)

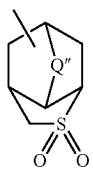
(S3)

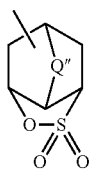
(S4)

wherein Q" represents an alkylene group of 1 to 5 carbon atoms, —O—, —S—, —O—$R^{94}$— or —S—$R^{95}$— (wherein each of $R^{94}$ and $R^{95}$ independently represents an alkylene group of 1 to 5 carbon atoms); and m represents 0 or 1.

As the alkylene group for Q" the same alkylene groups as those mentioned above for A" in the component (A) can be used.

As the alkylene group for $R^{94}$ and $R^{95}$, the same alkylene groups as those mentioned above for $R^{91}$ and $R^{92}$ can be used.

In these aliphatic cyclic groups, a part of the hydrogen atoms boned to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the aforementioned substituent groups for substituting a part or all of the hydrogen atoms can be used.

In the present invention, as X, a cyclic group which may have a substituent is preferable. The cyclic group may be either an aromatic hydrocarbon group which may have a substituent, or an aliphatic cyclic group which may have a substituent, and an aliphatic cyclic group which may have a substituent is more preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by formulas (L1) to (L5) and (S1) to (S4) are preferable.

In terms of the effects of the present invention, the anion moiety represented by general formula (b-7) above preferably has a fluorination ratio (i.e., percentage of the number of fluorine atoms, based on the total number of fluorine atoms and hydrogen atoms within the anion moiety) of 1 to 95%, more preferably 5 to 90%, and still more preferably 8 to 50%.

Furthermore, as an onium salt-based acid generator, a sulfonium salt having a cation moiety represented by general formula (b-5) or (b-6) shown below may be used.

[Chemical Formula 36.]

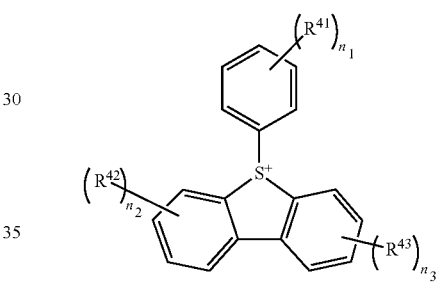
(b-5)

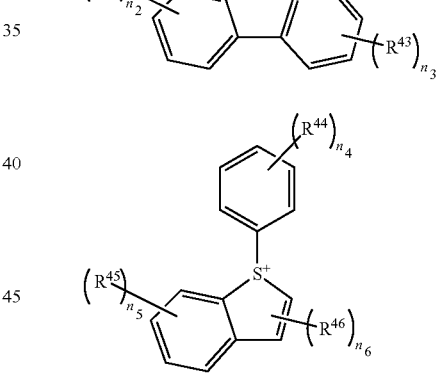
(b-6)

wherein each of $R^{41}$ to $R^{46}$ independently represents an alkyl group, an acetyl group, an alkoxy group, a carboxy group, a hydroxyl group or a hydroxyalkyl group; each of $n_1$ to $n_5$ independently represents an integer of 0 to 3; and $n_6$ represents an integer of 0 to 2.

With respect to $R^{41}$ to $R^{46}$ the alkyl group is preferably an alkyl group of 1 to 5 carbon atoms, more preferably a linear or branched alkyl group, and most preferably a methyl group, ethyl group, propyl group, isopropyl group, n-butyl group or tert butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably the aforementioned alkyl group in which one or more hydrogen atoms have been substituted with hydroxy groups, and examples thereof include a hydroxymethyl group, hydroxyethyl group and hydroxypropyl group.

If there are two or more of an individual $R^{41}$ to $R^{46}$ group, as indicated by the corresponding value of $n_1$ to $n_6$, then the two or more of the individual $R^{41}$ to $R^{46}$ group may be the same or different from each other.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties for onium salt-based acid generators which have been proposed may be used. Examples of such anion moieties include fluorinated alkylsulfonic acid ions such as anion moieties ($R^{4"}SO_3^-$) for onium salt-based acid generators represented by general formula (b-1) or (b-2) shown above; anion moieties represented by general formula (b-3) or (b-4) shown above; and anion moieties represented by general formula (b-7) shown above. Among these, a fluorinated alkylsulfonic acid ion is preferable, a fluorinated alkylsulfonic acid ion of 1 to 4 carbon atoms is more preferable, and a linear perfluoroalkylsulfonic acid ion is particularly desirable. Specific examples of such fluorinated alkylsulfonic acid ions include a trifluoromethylsulfonic acid ion, a heptafluoro-n-propylsulfonic acid ion and a nonafluoro-n-butylsulfonic acid ion.

In the present description, an oximesulfonate-based acid generator is a compound having at least one group represented by general formula (B-1) shown below, and has a feature of generating acid by irradiation. Such oximesulfonate-based acid generators are widely used for a chemically amplified resist composition, and can be appropriately selected.

[Chemical Formula 37.]

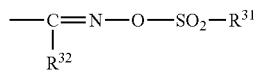

(B-1)

wherein each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "having a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 38.]

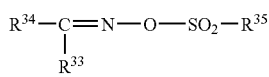

(B-2)

wherein $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 39.]

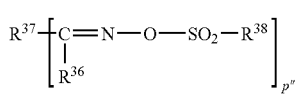

(B-3)

wherein $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include
α-(p-toluenesulfonyloxyimino)-benzyl cyanide,
α-(p-chlorobenzenesulfonyloxyimino)-benzyl cyanide,
α-(4-nitrobenzenesulfonyloxyimino)-benzyl cyanide,
α-(4-nitro-2-trifluoromethylbenzenesulfonyloxyimino)-benzyl cyanide,
α-(benzenesulfonyloxyimino)-4-chlorobenzyl cyanide,
α-(benzenesulfonyloxyimino)-2,4-dichlorobenzyl cyanide,
α-(benzenesulfonyloxyimino)-2,6-dichlorobenzyl cyanide,
α-(benzenesulfonyloxyimino)-4-methoxybenzyl cyanide,
α-(2-chlorobenzenesulfonyloxyimino)-4-methoxybenzyl cyanide,
α-(benzenesulfonyloxyimino)-thien-2-yl acetonitrile,
α-(4-dodecylbenzenesulfonyloxyimino)benzyl cyanide,
α-[(p-toluenesulfonyloxyimino)-4-methoxyphenyl] acetonitrile,
α-[(dodecylbenzenesulfonyloxyimino)-4-methoxyphenyl] acetonitrile,
α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile,
α-(methylsulfonyloxyimino)-1-cycloheptenyl acetonitrile,
α-(methylsulfonyloxyimino)-1-cyclooctenyl acetonitrile,
α-(trifluoromethylsulfonyloxyimino)-1-cyclopentenyl acetonitrile,
α-(trifluoromethylsulfonyloxyimino)-cyclohexyl acetonitrile,
α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile,
α-(cyclohexylsulfonyloxyimino)-cyclohexyl acetonitrile,
α-(cyclohexylsulfonyloxyimino)-1-cyclopentenyl acetonitrile,
α-(ethylsulfonyloxyimino)-1-cyclopentenyl acetonitrile,
α-(isopropylsulfonyloxyimino)-1-cyclopentenyl acetonitrile,
α-(n-butylsulfonyloxyimino)-1-cyclopentenyl acetonitrile,
α-(ethylsulfonyloxyimino)-1-cyclohexenyl acetonitrile,
α-(isopropylsulfonyloxyimino)-1-cyclohexenyl acetonitrile,
α-(n-butylsulfonyloxyimino)-1-cyclohexenyl acetonitrile,
α-(methylsulfonyloxyimino)-phenyl acetonitrile,
α-(methylsulfonyloxyimino)-p-methoxyphenyl acetonitrile,
α-(trifluoromethylsulfonyloxyimino)-phenyl acetonitrile,
α-(trifluoromethylsulfonyloxyimino)-p-methoxyphenyl acetonitrile,
α-(ethylsulfonyloxyimino)-p-methoxyphenyl acetonitrile,
α-(propylsulfonyloxyimino)-p-methylphenyl acetonitrile, and
α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Further, as preferable examples, the following can be exemplified.

[Chemical Formula 40.]

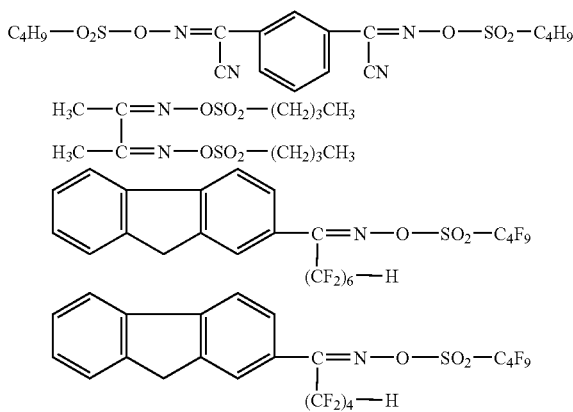

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane,
1,4-bis(phenylsulfonyldiazomethylsulfonyl)butane,
1,6-bis(phenylsulfonyldiazomethylsulfonyl)hexane,
1,10-bis(phenylsulfonyldiazomethylsulfonyl)decane,
1,2-bis(cyclohexylsulfonyldiazomethylsulfonyl)ethane,
1,3-bis(cyclohexylsulfonyldiazomethylsulfonyl)propane,
1,6-bis(cyclohexylsulfonyldiazomethylsulfonyl)hexane, and
1,10-bis(cyclohexylsulfonyldiazomethylsulfonyl)decane,
may be exemplified.

As the component (B), one type of acid generator may be used, or two or more types may be used in combination.

In the present invention, as the component (B), a compound represented by general formula (b1-1) shown below is preferable.

[Chemical Formula 41.]

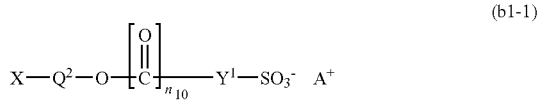

(b1-1)

wherein X and $Y^1$ are as defined above; $A^+$ represents an organic cation; $Q^2$ represents a single bond or an alkylene group; and $n_{10}$ represents 0 or 1.

In general formula (b1-1), as X, an aliphatic cyclic group which may have a substituent or an aromatic hydrocarbon group which may have a substituent is preferable. Of these, an aliphatic cyclic group which contains a hetero atom-containing substituent in the ring structure thereof is more preferable.

As the organic cation for $A^+$, there is no particular limitation, and any of those conventionally known as cation moiety for an onium salt-based acid generator can be appropriately selected for use. As the cation moiety, a sulfonium ion or an iodonium ion is preferable, and a sulfonium ion is particularly desirable. More specifically, the cation moiety of a compound represented by general formula (b-1) or (b-2) above, or the cation moiety of a compound represented by general formula (b-5) or (b-6) above can be preferably used.

As the alkylene group for $Q^2$, the same alkylene groups as those mentioned above for $Q^1$ can be used.

As $Q^2$, a single bond or a methylene group is particularly desirable. Especially, when X is an aliphatic cyclic group which may have a substituent, $Q^2$ is preferably a single bond. On the other hand, when X is an aromatic hydrocarbon group, $Q^2$ is preferably a methylene group.

$n_{10}$ may be either 0 or 1. When X is an aliphatic cyclic group which may have a substituent, $n_{10}$ is preferably 1. On the other hand, when X is an aromatic hydrocarbon group, $n_{10}$ is preferably 0.

Among compounds represented by general formula (b1-1) above, a compound represented by general formula (b1-1-1) shown below is particularly desirable.

[Chemical Formula 42.]

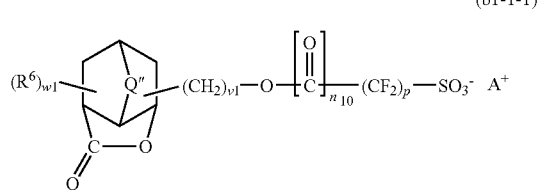

(b1-1-1)

wherein Q″, $n_{10}$ and $A^+$ are as defined above; p represents an integer of 1 to 3; v1 represents an integer of 0 to 3; w1 represents an integer of 0 to 3; and $R^6$ represents a substituent.

As the substituent for $R^6$, the same substituents as those which the aforementioned aliphatic hydrocarbon group or aromatic hydrocarbon group may have can be used.

If there are two or more of the $R^6$ group, as indicated by the value w1, then the two or more of the $R^6$ group may be the same or different from each other.

$A^+$ is preferably a sulfonium ion or an iodonium ion, more preferably a sulfonium ion, still more preferably the cation moiety of a compound represented by general formula (b-1) above or the cation moiety of a compound represented by general formula (b-5) above, and most preferably the cation moiety of a compound represented by general formula (b-1) above.

In the resist composition of the present invention, the amount of the component (B) is preferably 0.5 to 30 parts by weight, and more preferably 1 to 20 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

A compound represented by general formula (b1-1) above which is preferable as the component (B) can be produced by a conventional method. For example, the compound can be produced by a method including reacting a compound (b0-1) represented by general formula (b0-1) shown below with a compound (b0-2) represented by general formula (b0-2) shown below.

[Chemical Formula 43.]

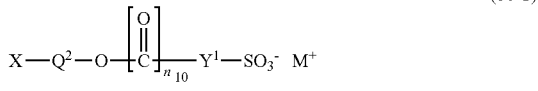

(b0-1)

$A^+ \ Z^-$ (b0-2)

In general formula (b0-1) above, X, $Q^2$, $n_{10}$ and $Y_1$ are respectively as defined for X, $Q^2$, $n_{10}$ and $Y^1$ in general formula (b1-1) above.

$M^+$ represents an alkali metal ion. Examples of alkali metal ions include a sodium ion, a lithium ion and a potassium ion, and a sodium ion or a lithium ion is preferable.

$Z^-$ represents a non-nucleophilic ion.

Examples of non-nucleophilic ions include a halogen ion such as a bromine ion or a chlorine ion; a sulfonic acid ion such as a p-toluenesulfonic acid ion, a methanesulfonic acid ion, benzenesulfonic acid ion or a trifluoromethanesulfonic acid ion; $BF_4^-$; $AsF_6^-$; $SbF_6^-$; $PF_6^-$; and $ClO_4^-$.

As the compound (b0-1) and the compound (b0-2), commercially available compounds may be used, or the compounds may be synthesized.

The method of producing the compound (b0-1) is not particularly limited. For example, a compound represented by general formula (b0-1-11) shown below can be dissolved in a solvent such a tetrahydrofuran or water, and the resulting solution can be subjected to a reaction in an aqueous solution of an alkali metal hydroxide such as sodium hydroxide or lithium hydroxide, thereby obtaining a compound represented by general formula (b0-1-12) shown below. Then, the compound represented by general formula (b0-1-12) can be subjected to a dehydration/condensation reaction with an alcohol represented by general formula (b0-1-13) shown below in an organic solvent such as benzene or dichloroethane in the presence of an acidic catalyst, thereby obtaining a compound represented by general formula (b0-1) above in which $n_{10}$ is 1 (i.e., a compound represented by general formula (b0-1-1) shown below).

[Chemical Formula 44.]

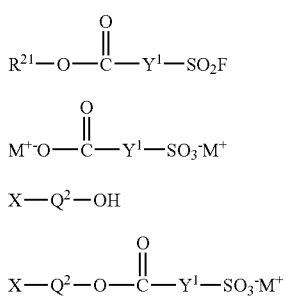

(b0-1-11)

(b0-1-12)

(b0-1-13)

(b0-1-1)

wherein $R^{21}$ represents an alkyl group of 1 to 5 carbon atoms; and X, $Q^2$, $Y^1$ and $M^+$ are respectively as defined for X, $Q^2$, $Y^1$ and $M^+$ in general formula (b0-1) above.

Alternatively, for example, silver fluoride, a compound represented by general formula (b0-1-01) shown below and a compound represented by general formula (b0-1-02) shown below can be subjected to a reaction in an organic solvent such as diglyme anhydride to obtain a compound represented by general formula (b0-1-03) shown below. Then, the compound represented by general formula (b0-1-03) can be reacted with an alkali metal hydroxide such as sodium hydroxide or lithium hydroxide in an organic solvent such as tetrahydrofuran, acetone or methyl ethyl ketone, thereby obtaining a compound represented by general formula (b0-1) above in which $n_{10}$ is 0 (i.e., a compound represented by general formula (b0-1-0) shown below).

In general formula (b0-1-02), as the halogen atom for $X_h$, a bromine atom or a chlorine atom is preferable.

[Chemical Formula 45.]

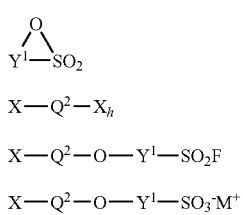

(b0-1-01)

(b0-1-02)

(b0-1-03)

(b0-1-0)

wherein X, $Q^2$, $Y^1$ and $M^+$ are respectively as defined for X, $Q^2$, $Y^1$ and $M^+$ in general formula (b0-1) above; and $X_h$ represents a halogen atom.

The reaction between the compound (b0-1) and the compound (b0-2) can be effected by dissolving the compounds in a solvent such as water, dichloromethane, acetonitrile, methanol, chloroform or methylene chloride, followed by stirring.

The reaction temperature is preferably 0 to 150° C., and more preferably 0 to 100° C. The reaction time varies depending on the reactivity of the compound (b0-1) and the compound (b0-2), the reaction temperature, and the like. However, in general, the reaction temperature is preferably 0.5 to 10 hours, and more preferably 1 to 5 hours.

In general, the amount of the compound (b0-2) used in the reaction is preferably 0.5 to 2 moles, per 1 mole of the compound (b0-1).

<Component (D)>

In the resist composition of the present invention, the component (D) includes a nitrogen-containing polymeric compound (D1) (hereafter, referred to as "component (D1)") which includes a structural unit (d0) containing a nitrogen atom in the side chain thereof By virtue of including the component (D1), various lithography properties such as depth of focus (DOF) and the like are improved in the formation of a resist pattern.

[Component (D1)]

The component (D1) is not particularly limited as long as it is a polymeric compound including a structural unit (d0) containing a nitrogen atom in the side chain thereof. As the component (D1), such a polymeric compound can be used alone, or two or more types of such polymeric compounds can be mixed together.

It is preferable that the component (D1) includes a structural unit (d1) derived from an acrylate ester containing an acid dissociable, dissolution inhibiting group, as well as the structural unit (d0).

Further, it is preferable that the component (D1) includes a structural unit (d2) derived from an acrylate ester containing a lactone-containing cyclic group, as well as the structural units (d0) and (d1).

Furthermore, it is preferable that the component (D1) includes a structural unit (d3) derived from an acrylate ester containing a polar group-containing aliphatic hydrocarbon group, as well as the structural units (d0) and (d1), or the structural units (d0), (d1) and (d2).

By virtue of the component (D1) including other structural units as well as the structural unit (d0), as described above, the solubility of the resist in a resist solvent is enhanced, and the effects of the present invention are improved.

Structural unit (d0)

In terms of ease in synthesis and improvement in the effects of the present invention, the structural unit (d0) is preferably a structural unit derived from an acrylate ester.

As described in connection with the component (A), the term "structural unit derived from an acrylate ester" refers to a structural unit which is formed by the cleavage of the ethylenic double bond of an acrylate ester.

Further, the structural unit (d0) is preferably a structural unit containing a group represented by general formula (I) shown below in the side chain thereof

[Chemical Formula 46.]

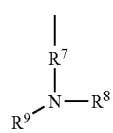

(I)

wherein $R^7$ represents an alkylene group which may have a substituent, a divalent aliphatic cyclic group which may have a substituent, or a divalent aromatic cyclic group which may have a substituent; and each of $R^8$ and $R^9$ independently represents a hydrogen atom, an alkyl group which may have a substituent, a monovalent aliphatic cyclic group which may have a substituent, or a monovalent aromatic cyclic group which may have a substituent; wherein $R^7$ and $R^8$ may be mutually bonded to form a ring with the nitrogen atom.

In general formula (I) above, $R^7$ to $R^9$ groups "may have as substituent" means that a part or all of the hydrogen atoms within each of the $R^7$ to $R^9$ groups may be substituted with an atom or group other than a hydrogen atom.

Examples of substituents include an alkyl group, a halogen atom, a halogenated alkyl group, a polar group and a polar group-containing group.

The alkyl group as the substituent for $R^7$ to $R^9$ preferably has 1 to 10 carbon atoms, more preferably 1 to 8, and still more preferably 1 to 5. Specific examples of alkyl groups include linear or branched alkyl groups such as a methyl group, an ethyl group, a propyl group, an isopropyl group, an n-butyl group, an isobutyl group, a tert-butyl group, a pentyl group, an isopentyl group and a neopentyl group.

Examples of halogen atoms include a fluorine atom, a chlorine atom, a bromine atom and an iodine atom, and a fluorine atom is preferable.

As a halogenated alkyl group, an alkyl group of 1 to 5 carbon atoms in which a part or all of the hydrogen atoms have been substituted with halogen atoms can be used, and a fluorinated alkyl group is particularly desirable.

With respect to the polar group and the polar group-containing group, specific examples of polar groups include an ether group (—O—), an ester group, a hydroxy group (—OH), a carbonyl group (—C(=O)—), a carboxy group (—COOH), an oxygen atom (=O), a cyano group (—CN), a lactone ring, an amino group (—NH$_2$), an amido group (—NHC(=O)—) and —CH(=O)—.

The polar group-containing group (hereafter, referred to as "polar group-containing substituent") is a group which contains a polar group in the structure thereof.

The polar group-containing substituent preferably has 1 to 10 carbon atoms, more preferably 1 to 8, and still more preferably 1 to 5. Examples of polar group-containing substituents include an alkyloxy group (alkoxy group), a hydroxyalkyloxy group, an alkyloxyalkyloxy group, an alkyloxycarbonyloxy group, an alkoxycarbonylalkyloxy group and an alkyloxycarbonyl group.

In general formula (I), each of $R^7$ and $R^9$ preferably has 1 to 50 carbon atoms, more preferably 2 to 50, and still more preferably 3 to 50.

The alkyl group for $R^8$ and $R^9$ may be linear or branched. Examples of alkyl groups include linear alkyl groups such as a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group; and branched alkyl groups such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

As the aliphatic cyclic group for $R^8$ and $R^9$, a cyclic saturated hydrocarbon group (a hydrocarbon ring having one hydrogen atom removed therefrom), a group in which the cyclic saturated hydrocarbon group is bonded to the terminal of the aforementioned alkyl group, or a group in which the cyclic saturated hydrocarbon group is present within the aforementioned alkyl group can be used. The cyclic saturated hydrocarbon group may be either a polycyclic group or a monocyclic group. For example, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane, cyclohexane, cycloheptane or cyclooctane; and groups in which one or more hydrogen atoms have been removed from a polycycloalkane such as adamantane, norbornane, isobornane, tricyclodecane or tetracyclododecane.

Examples of aromatic hydrocarbon groups for $R^8$ and $R^9$ include an aryl group which is an aromatic hydrocarbon ring having one hydrogen atom removed therefrom, such as a phenyl group, a biphenyl group, a fluorenyl group, a naphthyl group, an anthryl group or a phenanthryl group; a heteroaryl group which is the aforementioned aryl group in which a part of the carbon atoms constituting the aromatic hydrocarbon ring has been substituted with a hetero atom such as an oxygen atom, a sulfur atom or a nitrogen atom; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 to 2, and most preferably 1.

As the alkylene group, divalent aliphatic cyclic group and divalent aromatic cyclic group for $R^7$, groups in which one hydrogen atom has been removed from the alkyl groups, aliphatic cyclic groups and aromatic cyclic groups for $R^8$ and $R^9$ can be used.

$R^7$ and $R^8$ may be mutually bonded to form a ring with the nitrogen atom. That is, a cyclic group may be formed of $R^7$, $R^8$ and the nitrogen atom.

The cyclic group including the nitrogen atom is preferably a 4- to 7-membered ring, and more preferably a 4- to 6-membered ring.

In terms of the effects of the present invention, it is more preferable that the structural unit (d0) be a structural unit containing a piperidine skeleton in the side chain thereof, and a structural unit containing a cyclic group represented by general formula (d0-1-0) shown below in the side chain thereof is particularly desirable.

[Chemical Formula 47.]

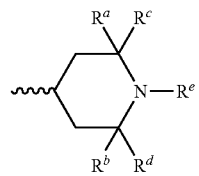

(d0-1-0)

wherein each of $R^a$ and $R^b$ independently represents an alkyl group, a halogen atom, a halogenated alkyl group, a polar group or a polar group-containing group; each of $R^c$ and $R^d$ independently represents a hydrogen atom, an alkyl group, a halogen atom, a halogenated alkyl group, a polar group or a polar group-containing group; and $R^e$ represents a hydrogen atom, an alkyl group which may have a substituent, a monovalent aliphatic cyclic group which may have a substituent or a monovalent aromatic cyclic group which may have a substituent.

In general formula (d0-1-0) above, as the alkyl group, halogen atom, halogenated alkyl group, polar group and polar group-containing group for $R^a$, $R^b$, $R^c$ and $R^d$, the same alkyl groups, halogen atoms, halogenated alkyl groups, polar groups and polar group-containing groups as those described above for $R^7$ to $R^9$ in general formula (I) can be used.

As $R^a$, $R^b$, $R^c$ and $R^d$, an alkyl group or an alkoxy group is preferable, more preferably an alkyl group, still more preferably a methyl group, and it is particularly desirable that each of $R^a$, $R^b$, $R^c$ and $R^d$ is a methyl group.

$R^e$ represents a hydrogen atom, an alkyl group which may have a substituent, a monovalent aliphatic cyclic group which may have a substituent or a monovalent aromatic cyclic group which may have a substituent. As $R^e$, the same groups as those for $R^9$ in general formula (I) above can be used. As $R^e$, an alkyl group is preferable, and more preferably a methyl group.

Specific examples of the structural unit (d0) are shown below.

[Chemical Formula 48.]

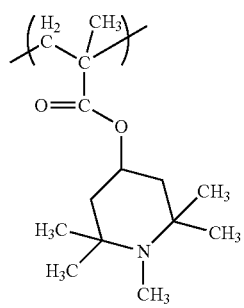
(d0-1-1)

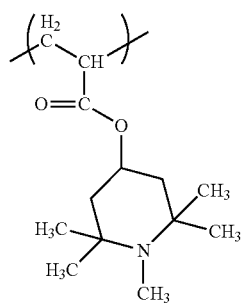
(d0-1-2)

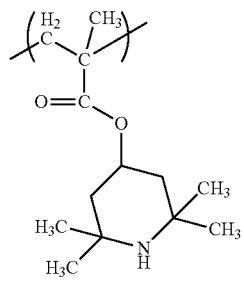
(d0-1-3)

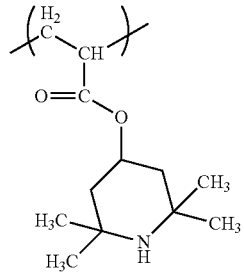
(d0-1-4)

As the structural unit (d0), a structural unit containing a cyclic group represented by general formula (d0-1-0) above in the side chain thereof is preferable, at least one structural unit selected from the group consisting of structural units represented by general formulas (d0-1-1) to (d0-1-4) above is more preferable, and a structural unit represented by general formula (d0-1-1) or (d0-1-2) above is particularly desirable.

As the structural unit (d0), one type of structural unit may be used alone, or two or more types may be used in combination.

In the component (D1), the amount of the structural unit (d0) based on the combined total of all structural units constituting the component (D1) is preferably 0.1 to 50 mol %, more preferably 0.1 to 20 mol %, and still more preferably 0.1 to 5 mol %. By making the amount of the structural unit (d0) at least as large as the lower limit of the above-mentioned range, a resist pattern having excellent lithography properties such a depth of focus (DOF) and the like can be formed. On the other hand, by making the amount of the structural unit (d0) no more than the upper limit of the above-mentioned range, a good balance can be achieved with the other structural units.

Structural unit (d1)

The structural unit (d1) is a structural unit derived from an acrylate ester containing an acid dissociable, dissolution inhibiting group.

As the structural unit (d1), the same structural units as those mentioned above for the structural unit (a1) can be used.

As the structural unit (d1), at least one structural unit selected from the group consisting of structural units represented by general formulas (a1-1) to (a1-4) above is preferable, more preferably a structural unit represented by general formula (a1-1) above, and a structural unit represented by general formula (a1-1-01) above is particularly desirable.

As the structural unit (d1), one type of structural unit may be used alone, or two or more types may be used in combination.

In the component (D1), the amount of the structural unit (d1) based on the combined total of all structural units constituting the component (D1) is preferably 10 to 80 mol %, more preferably 20 to 70 mol %, and still more preferably 25 to 50 mol %. By making the amount of the structural unit (d1) at least as large as the lower limit of the above-mentioned range, a pattern can be easily formed using a resist composition containing the component (D1). On the other hand, by making the amount of the structural unit (d1) no more than the upper limit of the above-mentioned range, a good balance can be achieved with the other structural units.

Structural unit (d2)

The structural unit (d2) is a structural unit derived from an acrylate ester containing a lactone-containing cyclic group.

As the structural unit (d2), the same structural units as those mentioned above for the structural unit (a2) can be used.

As the structural unit (d2), at least one structural unit selected from the group consisting of structural units represented by general formulas (a2-1) to (a2-5) above is preferable, more preferably at least one structural unit selected from the group consisting of structural units represented by general formulas (a2-1) to (a2-3) above, and a structural unit represented by general formula (a2-2) above is particularly desirable.

As the structural unit (d2), one type of structural unit may be used, or two or more types may be used in combination.

In the component (D1), the amount of the structural unit (d2) based on the combined total of all structural units constituting the component (D1) is preferably 5 to 60 mol %, more preferably 10 to 50 mol %, and still more preferably 20 to 50 mol %. By making the amount of the structural unit (d2) at least as large as the lower limit of the above-mentioned range, the effect of using the structural unit (d2) can be satisfactorily achieved. On the other hand, by making the amount of the structural unit d2) no more than the upper limit of the above-mentioned range, a good balance can be achieved with the other structural units.

Structural unit (d3)

The structural unit (d3) is a structural unit derived from an acrylate ester containing a polar group-containing aliphatic hydrocarbon group.

As the structural unit (d3), the same structural units as those mentioned above for the structural unit (a3) can be used. As the structural unit (d3), at least one structural unit selected from the group consisting of structural units represented by general formulas (a3-1) to (a3-3) above is preferable, and more preferably as structural unit represented by general formula (a3-1) above.

As the structural unit (d3), one type of structural unit may be used, or two or more types may be used in combination.

When the component (D1) contains the structural unit (d3), the amount of structural unit (d3) based on the combined total of all structural units constituting the component (D1) is preferably 5 to 50 mol %, more preferably 5 to 40 mol %, and still more preferably 5 to 25 mol %. By making the amount of the structural unit (d3) at least as large as the lower limit of the above-mentioned range, the effect of using the structural unit (d3) can be satisfactorily achieved. On the other hand, by making the amount of the structural unit (d3) no more than the upper limit of the above-mentioned range, a good balance can be achieved with the other structural units.

Other structural units

The component (D1) may also include a structural unit (d4) which is other than the structural units (d0) and the above-mentioned structural units (d1) to (d3), as long as the effects of the present invention are not impaired.

As the structural unit (d4), any other structural unit which cannot be classified as the structural unit (d0) and the structural units (d1) to (d3) can be used without any particular limitations, and any of the multitude of conventional structural units used within resist resins for ArF excimer lasers or KrF excimer lasers (and particularly for ArF excimer lasers) can be used.

As the structural unit (d4), for example, a structural unit derived from an acrylate ester containing a non-acid-dissociable aliphatic polycyclic group is preferable.

In the present invention, the component (D1) is a polymer containing the structural unit (d0). As such a polymer, a copolymer consisting of the structural units (d0), (d1), (d2) and (d3) can be used.

As such a copolymer, for example, a copolymer consisting of the 4 structural units in general formula (D1-11) shown below is preferable.

[Chemical Formula 49.]

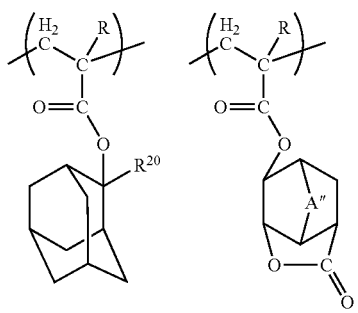

(D1-11)

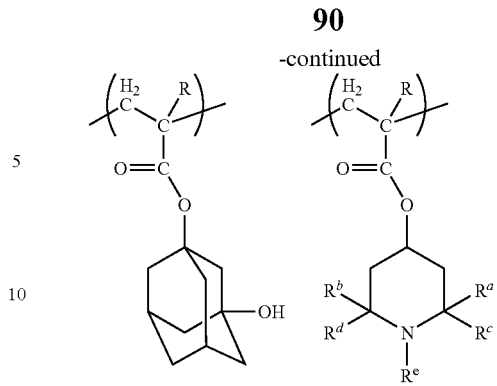

wherein R and A" are respectively as defined for R and A" described above in connection with the component (A), wherein the plurality of R may be the same or different; $R^{20}$ represents a lower alkyl group; and $R^a$ to $R^e$ are respectively as defined for $R^a$ to $R^e$ in general formula (d0-1-0) above.

In general formula (D1-11) above, as the lower alkyl group for $R^{20}$, the same lower alkyl groups as those for R can be used, a methyl group or an ethyl group is preferable, and an ethyl group is particularly desirable.

It is preferable that each of $R^a$ to $R^e$ be an alkyl group, and it is particularly desirable that each of $R^a$ to $R^e$ be a methyl group.

The component (D1) can be obtained, for example, by a conventional radical polymerization or the like of the monomers corresponding with each of the structural units, using a radical polymerization initiator such as azobisisobutyronitrile (AIBN).

The weight average molecular weight (Mw) (the polystyrene equivalent value determined by gel permeation chromatography) of the component (D1) is not particularly limited, but is preferably 2,000 to 50,000, more preferably 3,000 to 30,000, and most preferably 5,000 to 20,000. By making the weight average molecular weight no more than the upper limit of the above-mentioned range, the component (D1) exhibits satisfactory solubility in a resist solvent when used for a resist. On the other hand, by making the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5.

In the resist composition of the present invention, as the component (D1), one type of polymer may be used alone, or two or more types may be used in combination.

In the resist composition of the present invention, the amount of the component (D1) is preferably 0.1 to 50 parts by weight, more preferably 1 to 40 parts by weight, and most preferably 3 to 30 parts by weight, relative to 100 parts by weight of the component (A). By making the amount of the component (D1) at least as large as the lower limit of the above-mentioned range, a resist pattern having excellent lithography properties such a depth of focus (DOF) and the like can be formed. On the other hand, by making the amount of the component (D1) no more than the upper limit of the above-mentioned range, storage stability becomes satisfactory.

[Component (D2)]

In the resist composition of the present invention, for improving the resist pattern shape and the post exposure stability of the latent image formed by the pattern-wise exposure of the resist layer, it is preferable that the component (D) contain a nitrogen-containing organic compound (D2) other than the component (D1) (hereafter referred to as the component (D2)), as long as the effects of the present invention are not impaired.

A multitude of these components (D2) have already been proposed, and any of these known compounds other than the component (D1) may be used, although a cyclic amine or an aliphatic amine, and particularly a secondary aliphatic amine or tertiary aliphatic amine is preferable. An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine. Among these, an alkylalcoholamine and a trialkylamine is preferable, and a trialkylamine is more preferable, and tri-n-pentylamine is particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

As the component (D2), any one of these nitrogen-containing organic compounds usable as the component (D2) can be used either alone, or in combinations of two or more different compounds.

In the resist composition of the present invention, the component (D2) is typically used in an amount within a range from 0.01 to 5.0 parts by weight, relative to 100 parts by weight of the component (A).

<Optional Components>

[Component (E)]

Furthermore, in the resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

As the component (E), an organic carboxylic acid is preferable, and salicylic acid is particularly desirable.

The component (E) is typically used in an amount within a range from 0.01 to 5.0 parts by weight, relative to 100 parts by weight of the component (A).

If desired, other miscible additives can also be added to the resist composition of the present invention. Examples of such miscible additives include additive resins for improving the performance of the resist film, surfactants for improving the applicability, dissolution inhibitors, plasticizers, stabilizers, colorants, halation prevention agents, and dyes.

[Component (S)]

The resist composition of the present invention can be prepared by dissolving the materials for the resist composition in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME), and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the organic solvent is not particularly limited, and is appropriately adjusted to a concentration which enables coating of a coating solution to a substrate, depending on the thickness of the coating film. In general, the organic solvent is used in an amount such that the solid content of the resist composition becomes within the range from 2 to 20% by weight, and preferably from 5 to 15% by weight.

The resist composition of the present invention exhibits excellent lithography properties such a depth of focus (DOF) and the like. The reason for this has not yet been elucidated, but is presumed as follows.

The resist composition of the present invention contains a nitrogen-containing polymeric compound (D1) which includes a structural unit (d0) containing a nitrogen atom in the side chain thereof. As compared to a low molecular weight compound which has been conventionally used as a nitrogen-containing organic compound, the component (D1) is advantageous in that the diffusion of the component (D1) itself within the resist film is appropriately suppressed, and the component (D1) is uniformly dispersed. As a result, it is presumed that diffusion of the acid generated from the component (B) upon exposure can be effectively suppressed, thereby enabling formation of a resist pattern exhibiting excellent lithography properties such as depth of focus (DOF) and the like.

<<Method of Forming a Resist Pattern>>

The method of forming a resist pattern according to the second aspect of the present invention includes: applying a resist composition according to the first aspect of the present invention to a substrate to form a resist film on the substrate; conducting exposure of the resist film; and alkali-developing the resist film to form a resist pattern.

More specifically, the method for forming a resist pattern according to the present invention can be performed, for example, as follows. Firstly, a resist composition of the present invention is applied onto a substrate using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed to an ArF excimer laser beam through a desired mask pattern, followed by post exposure bake (PEB) under temperature conditions of 80 to 150° C. for 40 to 120 seconds, preferably 60 to 90 seconds. Subsequently, alkali developing is conducted using an alkali developing solution such as a 0.1 to 10% by weight aqueous solution of tetramethylammonium hydroxide (TMAH), preferably followed by rinsing with pure water, and drying. If desired, bake treatment (post bake) can be conducted following the alkali developing. In this manner, a resist pattern that is faithful to the mask pattern can be obtained.

The substrate is not specifically limited and a conventionally known substrate can be used. For example, substrates for electronic components, and such substrates having wiring patterns formed thereon can be mentioned. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be mentioned. As the organic film, an organic antireflection film (organic BARC) can be mentioned.

The wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The positive resist composition of the present invention is effective to KrF excimer laser, ArF excimer laser, EB and EUV, and particularly effective to ArF excimer laser.

The exposure of the resist film can be either a general exposure (dry exposure) conducted in air or an inert gas such as nitrogen, or immersion exposure (immersion lithography).

In immersion lithography, exposure (immersion exposure) is conducted in a state where the region between the lens and the resist layer formed on a wafer (which was conventionally filled with air or an inert gas such as nitrogen) is filled with a solvent (a immersion medium) that has a larger refractive index than the refractive index of air.

More specifically, in immersion lithography, the region between the resist film formed in the above-described manner and lens at the lowermost portion of the exposure apparatus is filled with a solvent (a immersion medium) that has a larger refractive index than the refractive index of air, and in this state, the resist film is subjected to exposure (immersion exposure) through a desired mask pattern.

The immersion medium preferably exhibits a refractive index larger than the refractive index of air but smaller than the refractive index of the resist film to be subjected to immersion exposure. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

EXAMPLES

As follows is a description of examples of the present invention, although the scope of the present invention is by no way limited by these examples.

Synthesis Example 1

Synthesis of Nitrogen-Containing Polymeric Compound (D1)

The nitrogen-containing polymeric compound (D1) used as a nitrogen-containing organic compound (D) in Examples 1 to 3 was obtained by copolymerization of the following monomers (1) to (4) by a conventional dropwise polymerization method.

[Chemical Formula 50.]

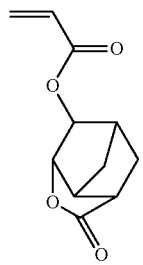

Monomer (1)

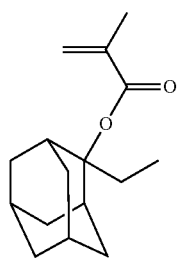

Monomer (2)

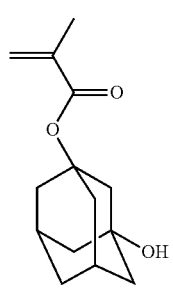

Monomer (3)

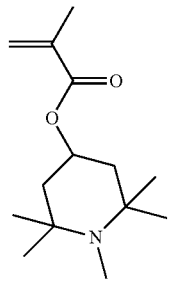

Monomer (4)

2.08 g (10.00 mmol) of a monomer (1), 2.48 g (10.00 mmol) of a monomer (2), 1.06 g (4.50 mmol) of a monomer (3) and 0.12 g (0.50 mmol) of a monomer (4) were dissolved in 13.39 g of tetrahydrofuran. Then, 0.45 mmol of a polymerization initiator (product name: V-601, manufactured by Wako Pure Chemical Industries, Ltd.) was added and dissolved in the obtained solution, and the resultant was subjected to a polymerization reaction in a nitrogen atmosphere at 80° C. for 6 hours.

After the completion of the reaction, the reaction mixture was cooled to room temperature. Then, the reaction mixture was concentrated under reduced pressure, and dropwise added to an excess amount of methanol to precipitate a polymer. The precipitated polymer was separated by filtration, followed by washing and drying, thereby obtaining 4.2 g of a nitrogen-containing polymeric compound (D1)-1 represented by chemical formula shown below.

[Chemical Formula 51.]

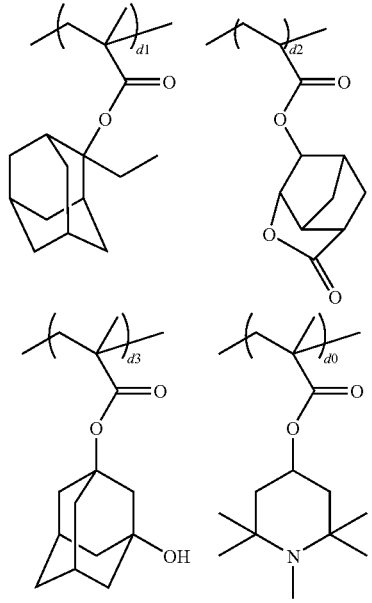

Nitrogen-containing polymeric compound (D1)-1

With respect to the nitrogen-containing polymeric compound (D1)-1, the weight average molecular weight and the dispersity were determined by the polystyrene equivalent value as measured by gel permeation chromatography (GPC). As a result, it was found that the weight average molecular weight was 9,700, and the dispersity was 1.55.

Further, the nitrogen-containing polymeric compound (D1)-1 was analyzed by $^{13}$C-NMR (600 MHz,). As a result, it was found that the composition of the polymer (ratio (molar ratio) of the respective structural units within the structural formula) was d1/d2/d3/d0=40.2/39.3/18.5/2.0.

Synthesis Example 2

Synthesis of Acid-Generator Component (B)

The acid generator (B)-1 used as an acid-generator component (B) in Examples 1 to 3 and Comparative Example 1 was synthesized by a method including the following steps (i) to (iv).

(i) 150 g of methyl fluorosulfonyl(difluoro)acetate and 375 g of pure water were maintained at 10° C. or lower in an ice bath, and 343.6 g of a 30% by weight aqueous solution of sodium hydroxide was dropwise added thereto. Then, the resultant was refluxed at 100° C. for 3 hours, followed by cooling and neutralizing with a concentrated hydrochloric acid. The resulting solution was dropwise added to 8,888 g of acetone, and the precipitate was collected by filtration and dried, thereby obtaining 184.5 g of a compound (I) in the form of a white solid (purity: 88.9%, yield: 95.5%).

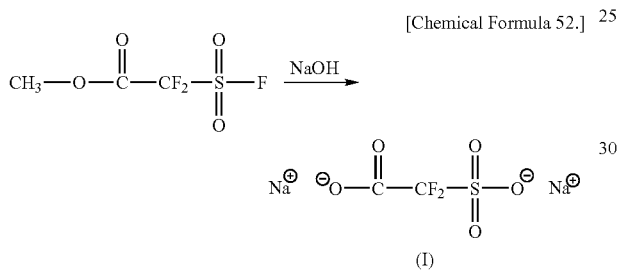

[Chemical Formula 52.]

(ii) 56.2 g of the compound (I) and 562.2 g of acetonitrile were prepared, and 77.4 g of p-toluenesulfonic acid monohydrate was added thereto. The resultant was refluxed at 110° C. for 3 hours. Then, the reaction liquid was filtered, and the filtrate was concentrated and dried to obtain a solid. 900 g of t-butyl methyl ether was added to the obtained solid and stirred. Thereafter, the resultant was filtered, and the residue was dried, thereby obtaining 22.2 g of a compound (II) in the form of a white solid (purity: 91.0%, yield: 44.9%).

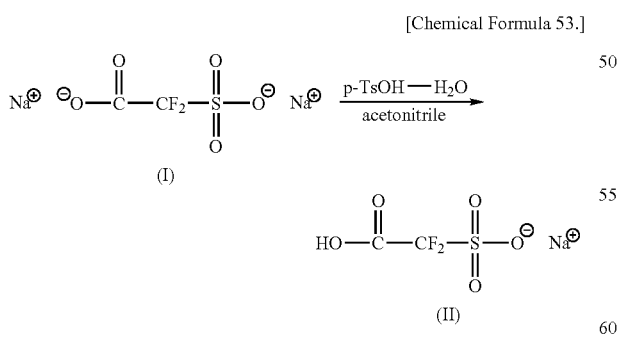

[Chemical Formula 53.]

(iii) 17.7 g of the compound (II) (purity: 91.9%), 13 g of a compound (II') represented by formula (II') shown below and 88.3 g of toluene were prepared, and 5.85 g of p-toluenesulfonic acid monohydrate was added thereto. The resultant was refluxed at 130° C. for 26 hours. Then, the reaction mixture was filtered, and 279.9 g of methyl ethyl ketone was added to the residue, followed by stirring. Thereafter, the resultant was filtered, and 84.0 g of methanol was added thereto, followed by stirring. The resultant was filtered, and the filtrate was dried, thereby obtaining 20.2 g of a compound (III) in the form of a white solid (purity: 99.9%, yield: 72.1%).

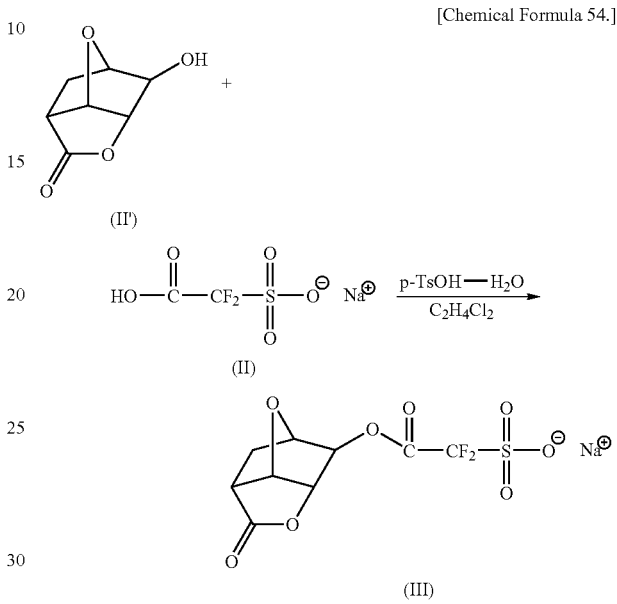

[Chemical Formula 54.]

(iv) 15.0 g of the compound (III) obtained in step (iii) (purity: 99.9%) was dissolved in 66.4 g of pure water. To the resulting solution was added 13.3 g of 4-methyltriphenylsulfonium bromide dissolved in 132.8 g of dichloromethane, followed by stirring at room temperature for 3 hours. Thereafter, the resultant was subjected to liquid separation to take out the organic phase. The organic phase was washed with 66.4 g of pure water, and then the organic phase was concentrated and dried, thereby obtaining 20.2 g of an objective compound (IV) in the form of a colorless viscous liquid (yield: 88.1%).

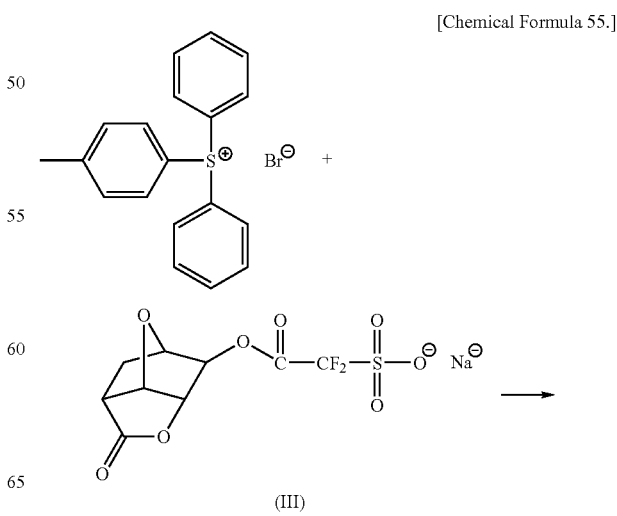

[Chemical Formula 55.]

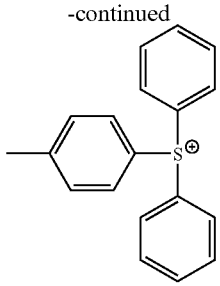

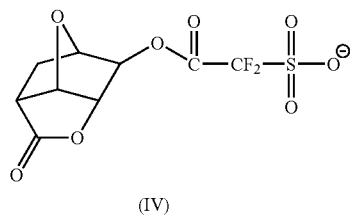

(IV)

The obtained compound (IV) was analyzed by NMR. The results are shown below.

$^1$H-NMR(DMSO, 400 MHz): δ(ppm)=7.86-7.58(m,14H, Ha+Hb), 5.48(m,1H,Hd), 4.98(s,1H,He), 4.73-4.58(d,2H, Hf), 2.71(m,1H,Hg), 2.43(m,3H,Hc), 2.12(m,2H,Hf).

$^{19}$F-NMR(DMSO, 376MHz): δ(ppm)=−106.9.

From the results above, it was confirmed that the compound (IV) had a structure shown below.

[Chemical Formula 56.]

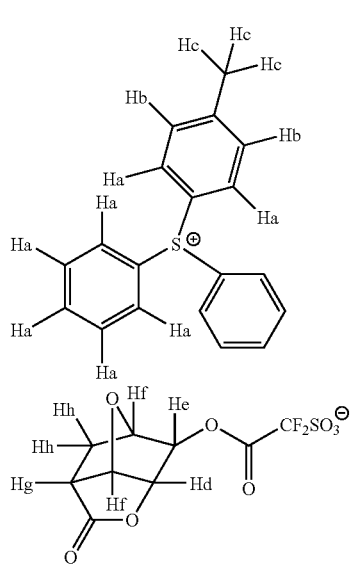

<Preparation of Resist Composition>

The components shown in Table 1 were mixed together and dissolved to obtain a positive resist composition.

TABLE 1

|  | Component (A) | Component (B) | Component (D) | Component (S) |
|---|---|---|---|---|
| Ex. 1 | (A)-1 [100] | (B)-1 [10.0] | (D1)-1 [5.0] | (S)-1 [2400] |
| Ex. 2 | (A)-1 [100] | (B)-1 [10.0] | (D1)-1 [10.0] | (S)-1 [2400] |

TABLE 1-continued

|  | Component (A) | Component (B) | Component (D) | Component (S) |
|---|---|---|---|---|
| Ex. 3 | (A)-1 [100] | (B)-1 [10.0] | (D1)-1 [20.0] | (S)-1 [2400] |
| Comp. Ex. 1 | (A)-1 [100] | (B)-1 [10.0] | — | (S)-1 [2400] |

In Table 1, the reference characters indicate the following. Further, the values in brackets [ ] indicate the amount (in terms of parts by weight) of the component added.

(A)-1: a copolymer represented by chemical formula (A)-1 shown below (wherein the ratio of the individual structural units constituting the copolymer, based on the combined total of all structural units was a1/a2/a3=40/40/20 (molar ratio)) with Mw=10,000 and Mw/Mn=2.0

(B)-1: an acid generator represented by chemical formula (B)-1 shown below (the aforementioned compound (IV))

(D1)-1: the aforementioned nitrogen-containing polymeric compound (D1)-1

(S)-1: a mixed solvent of PGMEA/PGME=6/4 (weight ratio)

[Chemical Formula 57.]

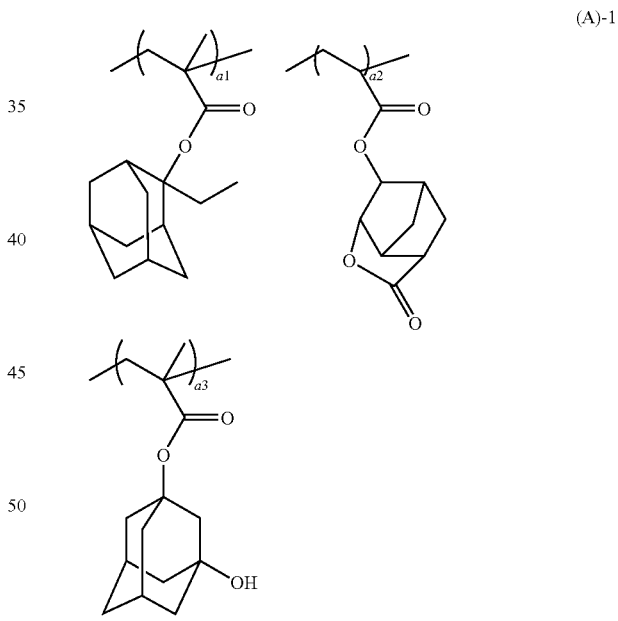

[Chemical Formula 58.]

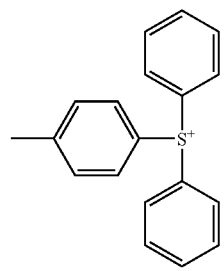

-continued

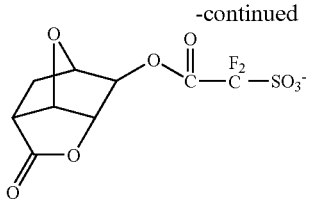

<Evaluation of Lithography Properties>

Using the positive resist compositions obtained above, resist patterns were formed by a method described below, and lithography properties (sensitivity, depth of focus (DOF)) were evaluated.

[Formation of Resist Pattern]

An organic anti-reflection film composition (product name: ARC29A, manufactured by Brewer Science Ltd.) was applied onto a 12-inch silicon wafer using a spinner, and the composition was then baked at 205° C. for 60 seconds, thereby forming an organic anti-reflection film having a film thickness of 89 nm. Then, each of the positive resist compositions obtained above was applied onto the anti-reflection film using a spinner, and was then prebaked (PAB) on a hotplate at 90° C. for 60 seconds and dried, thereby forming a resist film having a film thickness of 120 nm.

Subsequently, a coating solution for forming a protection film (product name: TSRC-002; manufactured by Tokyo Ohka Kogyo Co., Ltd.) was applied onto the resist film using a spinner, and then heated at 90° C. for 60 seconds, thereby forming a top coat with a film thickness of 28 nm.

Thereafter, using an ArF exposure apparatus for immersion lithography (product name: NSR-S609B, manufactured by Nikon Corporation, NA (numerical aperture)=1.07, 2/3 annular illumination), the resist film having a top coat formed thereon was selectively irradiated with an ArF excimer laser (193 nm) through a mask having a hole pattern.

Next, the top coat was removed using a protection-film removing solution (product name: TS-Rememover-S; manufactured by Tokyo Ohka Kogyo Co., Ltd.). Then, a post exposure bake (PEB) treatment was conducted at 95° C. for 60 seconds, followed by alkali development for 30 seconds at 23° C. in a 2.38% by weight aqueous solution of tetramethylammonium hydroxide (product name: NMD-W; manufactured by Tokyo Ohka Kogyo Co., Ltd.). Then, the resist film was rinsed for 25 seconds with pure water, followed by drying by shaking.

As a result, in each of the examples, a contact hole pattern (hereafter, referred to as "dense CH pattern") in which holes having a diameter of 70 nm were equally spaced (pitch: 131 nm) was formed on the resist film.

The lithography properties of the formed dense CH patterns were evaluated.

[Sensitivity]

The optimum exposure dose (sensitivity: Eop, mJ/cm$^2$) with which a dense CH pattern having a hole diameter of 70 nm and a pitch of 131 nm was formed was determined. The results are shown in Table 2.

[Evaluation of Depth of Focus]

With the above-mentioned Eop, the focus was appropriately shifted up and down and resist patterns were formed in the same manner as in the "formation of resist pattern", and the depth of focus (DOF) (unit: nm) with which a dense CH pattern was formed within the range where the variation in the target size of the dense CH pattern was ±5% (i.e., 66.5 to 73.5 nm) was determined. The results are shown in Table 2.

TABLE 2

|  | Ex. 1 | Ex. 2 | Ex. 3 | Comp. Ex. 1 |
|---|---|---|---|---|
| Eop (mJ/cm$^2$) | 45.1 | 49.6 | 60.0 | 39.8 |
| DOF (nm) | 0.21 | 0.21 | 0.23 | 0.13 |

From the results shown above, it was found that the positive resist compositions of Examples 1 to 3 containing a nitrogen-containing polymeric compound (D1) (i.e., positive resist compositions within the scope of the present invention) exhibited a large DOF value as compared to the positive resist composition of Comparative Example 1 containing no component (D1) (i.e., a positive resist composition outside the scope of the present invention). Thus, it was confirmed that the positive resist composition of the present invention exhibits excellent lithography properties.

The invention claimed is:

1. A resist composition comprising a base component (A) which exhibits changed solubility in an alkali developing solution under action of acid, an acid-generator component (B) which generates acid upon exposure, and a nitrogen-containing organic compound (D), which suppresses diffusion of the acid generated from the acid-generator component (B) upon exposure, said nitrogen-containing organic compound (D) comprising a nitrogen-containing polymeric compound (D1) comprised of a structural unit (d0) containing a cyclic group represented by general formula (d0-1-0) shown below in the side chain thereof:

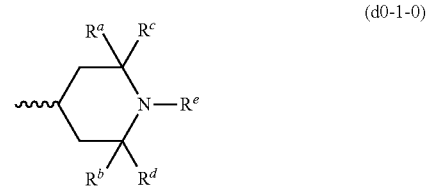

(d0-1-0)

wherein each of $R^a$ and $R^b$ independently represents an alkyl group, a halogen atom, a halogenated alkyl group, a polar group or a polar group-containing group; each of $R^c$ and $R^d$ independently represents a hydrogen atom, an alkyl group, a halogen atom, a halogenated alkyl group, a polar group or a polar group-containing group; and $R^e$ represents a hydrogen atom, an alkyl group which may have a substituent, a monovalent aliphatic cyclic group which may have a substituent or a monovalent aromatic cyclic group which may have a substituent.

2. The resist composition according to claim 1, wherein said structural unit (d0) is a structural unit derived from acrylate ester.

3. The resist composition according to claim 1, wherein said nitrogen-containing polymeric compound (D1) further comprises a structural unit (d1) derived from an acrylate ester containing an acid dissociable, dissolution inhibiting group.

4. The resist composition according to claim 3, wherein said nitrogen-containing polymeric compound (D1) further comprises a structural unit (d2) derived from an acrylate ester containing a lactone-containing cyclic group.

5. The resist composition according to claim 3, wherein said nitrogen-containing polymeric compound (D1) further comprises a structural unit (a3) derived from an acrylate ester containing a polar group-containing aliphatic hydrocarbon group.

6. The resist composition according to claim 1, wherein said base component (A) is a base component (A') which exhibits increased solubility in an alkali developing solution under action of acid.

7. The resist composition according to claim 6, wherein said base component (A') comprises a resin component (A1) comprised of a structural unit (a1) derived from an acrylate ester containing an acid dissociable, dissolution inhibiting group.

8. The resist composition according to claim 7, wherein said resin component (A1) further comprises a structural unit (a2) derived from an acrylate ester containing a lactone-containing cyclic group.

9. The resist composition according to claim 7, wherein said resin component (A1) further comprises a structural unit (a3) derived from an acrylate ester containing a polar group-containing aliphatic hydrocarbon group.

10. A method of forming a resist pattern, comprising: using a resist composition of claim 1 to form a resist film on the substrate; conducting exposure of said resist film; and alkali-developing said resist film to form a resist pattern.

11. The resist composition according to claim 1, wherein said acid-generator component (B) comprises an onium salt-based acid generator represented by general formula (b-1) or (b-2) shown below:

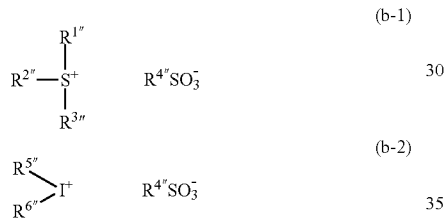

wherein $R^{1''}$ to $R^{3''}$, $R^{5''}$ and $R^{6''}$ each independently represents an aryl group or alkyl group, wherein two of $R^{1''}$ to $R^{3''}$ in formula (b-1) may be bonded to each other to form a ring with the sulfur atom; and $R^{4''}SO_3^-$ is an anion moiety represented by general formula (b-7) shown below, with the proviso that at least one of $R^{1''}$ to $R^{3''}$ represents an aryl group, and at least one of $R^{5''}$ and $R^{6''}$ represents an aryl group, $$X\text{-}Q^1\text{-}Y^1\text{—}SO_3^- \qquad (b\text{-}7)$$

wherein $Q^1$ represents a divalent linkage group containing an oxygen atom; $Y^1$ represents an alkylene group of 1 to 4 carbon atoms which may have a substituent or a flu-orinated alkylene group of 1 to 4 carbon atoms which may have a substituent; and X represents a hydrocarbon group of 3 to 30 carbon atoms which may have a substituent.

12. The resist composition according to claim 11, wherein said onium salt-based acid generator is represented by general formula (b1-1) shown below:

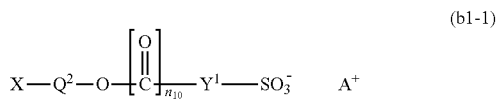

wherein X represents a hydrocarbon group of 3 to 30 carbon atoms which may have a substituent;

$Y^1$ represents an alkylene group of 1 to 4 carbon atoms which may have a substituent or a fluorinated alkylene group of 1 to 4 carbon atoms which may have a substituent; $A^+$ represents an organic cation; $Q^2$ represents a single bond or an alkylene group; and $n_{10}$ represents 0 or 1.

13. The resist composition according to claim 12, wherein said onium salt-based acid generator is represented by general formula (b1-1-1) shown below:

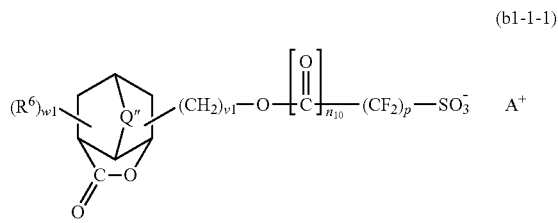

wherein Q" represents an alkylene group of 1 to 5 carbon atoms, —O—, —S—, —O—$R^{94}$— or —S—$R^{95}$— (wherein each of $R^{94}$ and $R^{95}$ independently represents an alkylene group of 1 to 5 carbon atoms);

$n_{10}$ represents 0 or 1; $A^+$ represents an organic cation; p represents an integer of 1 to 3; v1 represents an integer of 0 to 3; w1 represents an integer of 0 to 3; and $R^6$ represents a substituent.

* * * * *

UNITED STATES PATENT AND TRADEMARK OFFICE
CERTIFICATE OF CORRECTION

PATENT NO. : 7,960,091 B2
APPLICATION NO. : 12/356011
DATED : June 14, 2011
INVENTOR(S) : Hiroaki Shimizu, Tsuyoshi Nakamura and Takahiro Dazai It is certified that error appears in the above-identified patent and that said Letters Patent is hereby corrected as shown below:

At Column 7, Line 6, Change "(a1'-1) to (a1'-6)" to --(a1"-1) to (a1"-6)--.

At Column 7, Line 6, Change "(a1'-1) to (a1'-6)" to --(a1"-1) to (a1"-6)--.

At Column 8, Line 58-63 (Approx.),

Change " 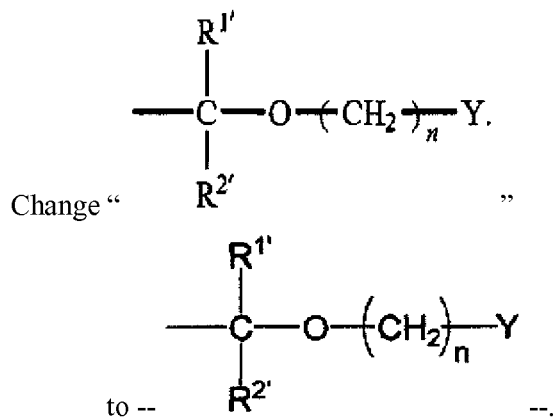 ".

At Column 9, Line 3, Change "$R^{2\prime\prime}$" to --$R^{2\prime}$,--.

At Column 9, Line 17-19 (Approx.),

Change " 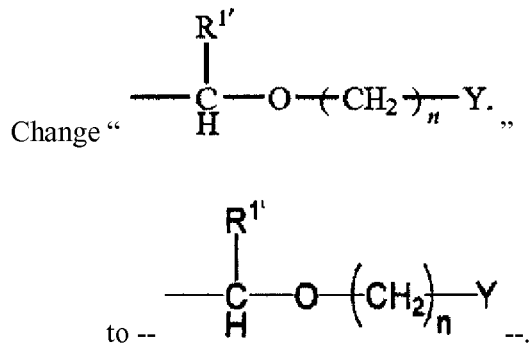 ".

Signed and Sealed this
Twenty-eighth Day of February, 2012

David J. Kappos
*Director of the United States Patent and Trademark Office*

At Column 9, Line 37-40 (Approx.),
Change " 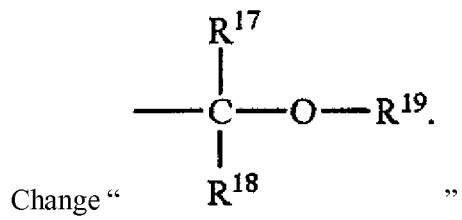 ,"
to -- 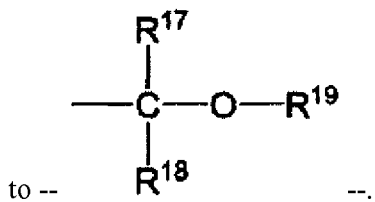 --.
At Column 10, Line 32-38 (Approx.),
Change " 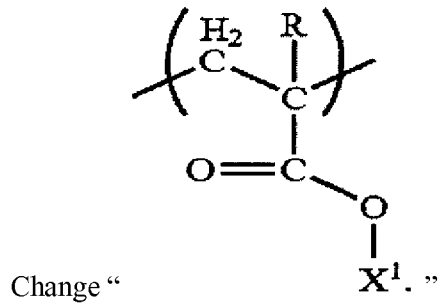 ."
to -- 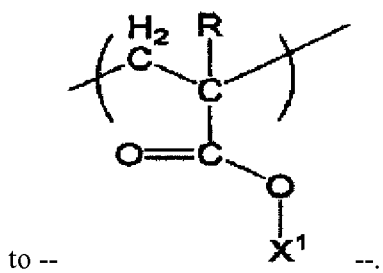 --.

CERTIFICATE OF CORRECTION (continued)
U.S. Pat. No. 7,960,091 B2

At Column 10, Line 47-58 (Approx.),

Change "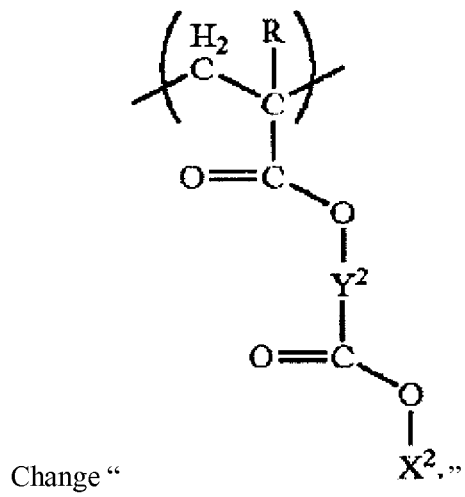"

to --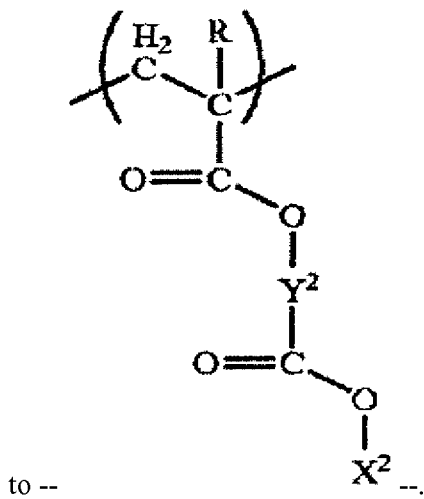--.

At Column 11, Line 10, Change "X1" to --$X^1$--.

At Column 21, Line 56-65,

Change "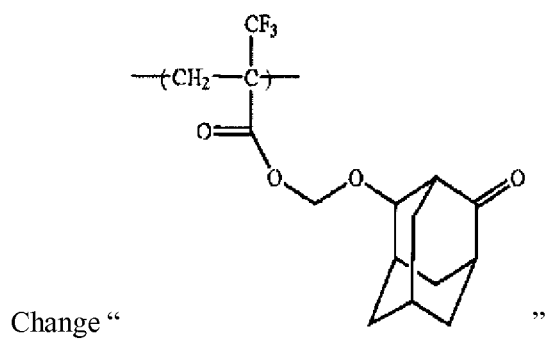"

CERTIFICATE OF CORRECTION (continued)
U.S. Pat. No. 7,960,091 B2 to -- 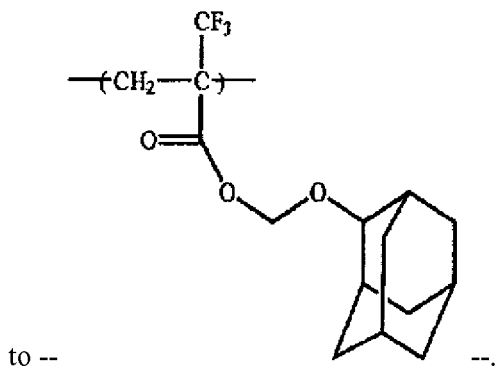 --.

At Column 22, Line 2-12 (Approx.),

Change " 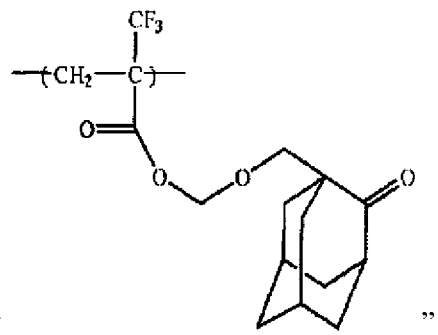 "

to -- 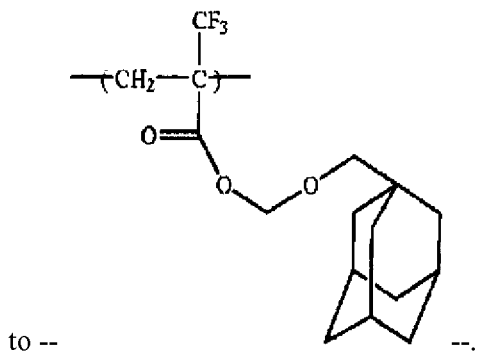 --.

At Column 51, Line 44, Change "to" to --or--.

At Column 63, Line 31 (Approx.), Change "to 2," to --or 2,--.

At Column 68, Line 6, After "group" insert --.--.

At Column 71, Line 48, Change "(CH$_2$C$_3$)—." to --(CH$_2$CH$_3$)—.--.

At Column 72, Line 28, Change "to 2," to --or 2,--.

At Column 75, Line 47 (Approx.), Change "Q''" to --Q'',--.

At Column 76, Line 55, Change "R$^{46}$the''" to --R$^{46}$, the--.

CERTIFICATE OF CORRECTION (continued)
U.S. Pat. No. 7,960,091 B2

At Column 81, Line 30, After "preferable" insert --.--.

At Column 82, Line 41 (Approx.), Change "$Y_1$" to --$Y^1$--.

At Column 84, Line 6 (Approx.), Change "thereof" to --thereof.--.

At Column 84, Line 46, After "thereof" insert --.--.

At Column 86, Line 20, Change "to 2," to --or 2,--.

At Column 94, Line 44, Change "at" to --as--.

At Column 100, Line 20, After "2.0" insert --.--.

At Column 102, Line 33-39 (Approx.)

In Claim 1, change " 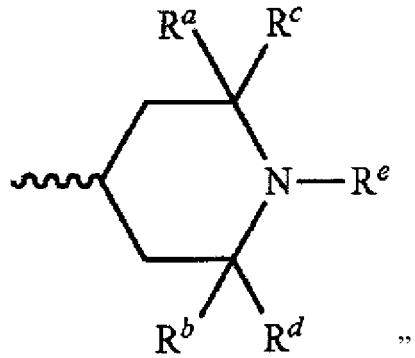 "

to -- 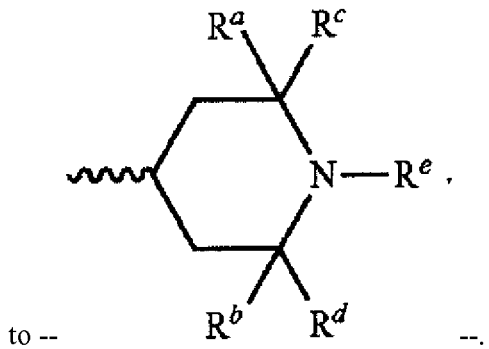 --.

At Column 104, Line 44 (Approx.), In Claim 13, change "v1represents" to --v1 represents--.